(12) United States Patent
Srinivasan

(10) Patent No.: US 11,119,153 B1
(45) Date of Patent: Sep. 14, 2021

(54) ISOLATION ENABLE TEST COVERAGE FOR MULTIPLE POWER DOMAINS

(71) Applicant: STMicroelectronics International N.V., Geneva (CH)

(72) Inventor: Venkata Narayanan Srinivasan, Greater Noida (IN)

(73) Assignee: STMICROELECTRONICS INTERNATIONAL N.V., Geneva (CH)

( * ) Notice: Subject to any disclaimer, the term of this patent is extended or adjusted under 35 U.S.C. 154(b) by 0 days.

(21) Appl. No.: 16/888,059

(22) Filed: May 29, 2020

(51) Int. Cl.
*G01R 31/3177* (2006.01)
*G01R 31/3185* (2006.01)
*G01R 31/317* (2006.01)
*G01R 31/28* (2006.01)

(52) U.S. Cl.
CPC ..... *G01R 31/3177* (2013.01); *G01R 31/2853* (2013.01); *G01R 31/31717* (2013.01); *G01R 31/31721* (2013.01); *G01R 31/31855* (2013.01)

(58) Field of Classification Search
CPC .......... G01R 31/3177; G01R 31/31721; G01R 31/31717; G01R 31/31855; G01R 31/2853
USPC .......................... 714/727, 726, 729, 724, 735
See application file for complete search history.

(56) References Cited

U.S. PATENT DOCUMENTS

| | | | | |
|---|---|---|---|---|
| 8,607,177 | B2* | 12/2013 | Verbeure | G06F 30/327 |
| | | | | 716/109 |
| 9,172,358 | B1* | 10/2015 | Wang | H03K 3/0375 |
| 9,305,128 | B2* | 4/2016 | Verbeure | G06F 30/327 |
| 9,423,846 | B2* | 8/2016 | Smith | G06F 1/32 |
| 9,465,771 | B2* | 10/2016 | Davis | G06F 1/266 |
| 9,489,317 | B2* | 11/2016 | Sauer | G06F 12/1458 |
| 9,640,280 | B1* | 5/2017 | Arora | G01R 31/3177 |
| 10,310,013 | B2* | 6/2019 | Ge | G01R 31/31721 |
| 10,955,472 | B1* | 3/2021 | Track | G01R 31/3177 |
| 2008/0235545 | A1* | 9/2008 | Jayaram | G01R 31/318547 |
| | | | | 714/729 |
| 2009/0256607 | A1* | 10/2009 | Smith | G06F 1/32 |
| | | | | 327/198 |

(Continued)

OTHER PUBLICATIONS

Chakravadhanula et al., Why is Conventional ATPG Not Sufficient for Advanced Low Power Designs?, 2009, IEEE, pp. 295-300. (Year: 2009).*

(Continued)

*Primary Examiner* — John J Tabone, Jr.
(74) *Attorney, Agent, or Firm* — Slater Matsil, LLP

(57) ABSTRACT

A method of testing a multiple power domain device includes sending a control signal from a test controller powered by a switchable power domain to a non-scan test data register powered by an always on power domain. The method further includes setting, using the control signal, a test data register value of the register to enable scan mode by bypassing an isolation cell between an output of the switchable domain and an input of the always on domain and, while the register value continuously enables scan mode: shifting a test pattern into a scan chain including a flip-flop coupled to the isolation cell, capturing a test result from the scan chain, and shifting the test pattern out of the scan chain to observe the test result. The isolation cell is configured to allow or disallow propagation of a signal from the output to the input.

20 Claims, 11 Drawing Sheets

(56) References Cited

U.S. PATENT DOCUMENTS

| | | | | |
|---|---|---|---|---|
| 2009/0259982 A1* | 10/2009 | Verbeure | ............... | G06F 30/327 |
| | | | | 716/129 |
| 2014/0122833 A1* | 5/2014 | Davis | ................. | G06F 15/7803 |
| | | | | 712/29 |
| 2014/0149812 A1* | 5/2014 | Tekumalla | ....... | G01R 31/31705 |
| | | | | 714/727 |
| 2014/0181769 A1* | 6/2014 | Verbeure | ............... | G06F 30/327 |
| | | | | 716/109 |
| 2016/0092377 A1* | 3/2016 | Sauer | .................... | G06F 1/3243 |
| | | | | 711/163 |
| 2016/0154760 A9* | 6/2016 | Davis | .................... | G06F 13/102 |
| | | | | 710/104 |
| 2017/0115712 A1* | 4/2017 | Davis | .................... | G06F 9/4406 |

OTHER PUBLICATIONS

Chakravadhanula et al., Test Generation for State Retention Logic, 2008, IEEE, pp. 237-242. (Year: 2008).*

Mbarek, An electronic system level modeling approach for the design and verification of low-power systems-on chip, Nov. 18, 2013, HAL, pp. 1-311. (Year: 2013).*

Mbarek, A Flexible Protocol Interface for Transaction-Level Power Domain Management, Jul. 2013, IET Computers & Digital Techniques, vol. 7, Iss. 4, pp. 155-166. (Year: 2013).*

* cited by examiner

ISOLATION ENABLE TEST COVERAGE FOR MULTIPLE POWER DOMAINS

TECHNICAL FIELD

The present invention relates generally to isolation enable test coverage for multiple power domains, and, in particular embodiments, to methods of testing for isolation enable faults in devices and systems including multiple power domains as well as to the devices and systems utilized therein.

BACKGROUND

As electronic devices become more and more complicated, hardware validation during manufacturing becomes increasingly important. Design for test (DFT) techniques are typically used to incorporate testability features into hardware design to improve testing capabilities. For example, a test controller, test registers, logic, and other components may be included in circuit design so that the circuit can be effectively tested. DFT is commonly used in conjunction with automatic test pattern generation (ATPG) to test for defective digital circuits in an automated fashion.

A test controller may be used to provide an interface between a general purpose computing device and a device under test (DUT) control. Test controllers may be external or integrated into the DUT. Industry standards such as the joint test action group (JTAG) standardize on-chip instrumentation for testing by specifying a serial communication interface that affords access to test registers.

A multiple power domain device such as a system on a chip (SoC) includes two more power domains with different characteristics. For example, the power domains may operate at different voltage levels or be individually capable of being switched on and off. In order to avoid unknown states, some or all of the signals between different power domains pass through isolation cells that can be enabled to disallow signal propagation (e.g. when a power domain is switched off) or disabled to allow signals to pass between the power domains.

Conventional DFT configurations for multiple power domain devices may not enable test coverage of all isolation enable faults. For instance, isolation enable signals may not be included during scans or may be forced to remain static for testing purposes. Therefore, DFT techniques that allow testing of isolation enable faults in multiple power domain devices may be desirable.

SUMMARY

In accordance with an embodiment of the invention, a method of testing a multiple power domain device includes sending a test control signal from a test controller powered by a first switchable power domain to a non-scan test data register powered by an always on power domain. The always on power domain includes an always on input and is configured to always receive power while the multiple power domain device is powered. The first switchable power domain includes a first switchable output and is configured to be switched between a powered state and an unpowered state while the multiple power domain device is powered. The method further includes setting, using the test control signal, a test data register value of the test data register to enable a scan mode by bypassing a first isolation cell between the first switchable output and the always on input, and, while the test data register value continuously enables the scan mode: shifting a test pattern into a scan chain including a functional isolation enable flip-flop coupled to the first isolation cell, capturing a test result from the scan chain, and shifting the test pattern out of the scan chain to observe the test result. The first isolation cell is configured to allow or disallow a first signal originating from the first switchable output to propagate through the first isolation cell to the always on input.

In accordance with another embodiment of the invention, a method of testing a multiple power domain device includes sending a test control signal from a test controller powered by a first switchable power domain to a non-scan test data register powered by an always on power domain. The always on power domain includes an always on input and core wrapped logic the always on power domain being configured to always receive power while the multiple power domain device is powered. The first switchable power domain includes an first switchable output and is configured to be switched between a powered state and an unpowered state while the multiple power domain device is powered. The always on power domain further includes an always on multiplexer including an always on multiplexer output coupled to a first isolation cell configured to allow or disallow a first signal from propagating from the first switchable output to the always on input. The method further includes setting a test data register value of the test data register to a first value using the test control signal, the test data register value being coupled to an always on selector input of the always on multiplexer, inputting a forced isolation signal at an always on domain connection, selecting the forced isolation signal using the first value at the always on selector input, and, while the forced isolation signal is continuously selected by the first value, testing the always on power domain of the multiple power domain device.

In accordance with still another embodiment of the invention, a multiple power domain device includes an always on power domain including an always on input and configured to always receive power while the multiple power domain device is powered, a first switchable power domain including an first switchable output and configured to be switched between a powered state and an unpowered state while the multiple power domain device is powered, an isolation cell coupled between the first switchable output and the always on input, an isolation enable circuit powered by the always on power domain and configured to output an isolation enable signal to allow or disallow a first signal originating at the first switchable output from propagating to the always on input, a non-scan test data register powered by the always on power domain, and a test controller powered by the first switchable power domain and coupled to the test data register. The test controller is configured to send a test control signal to the test data register to set a test data register value and test for isolation enable faults by using the test data register value to maintain a scan mode of the always on power domain while the isolation enable signal is toggled.

BRIEF DESCRIPTION OF THE DRAWINGS

For a more complete understanding of the present invention, and the advantages thereof, reference is now made to the following descriptions taken in conjunction with the accompanying drawings, in which.

Figure 1:
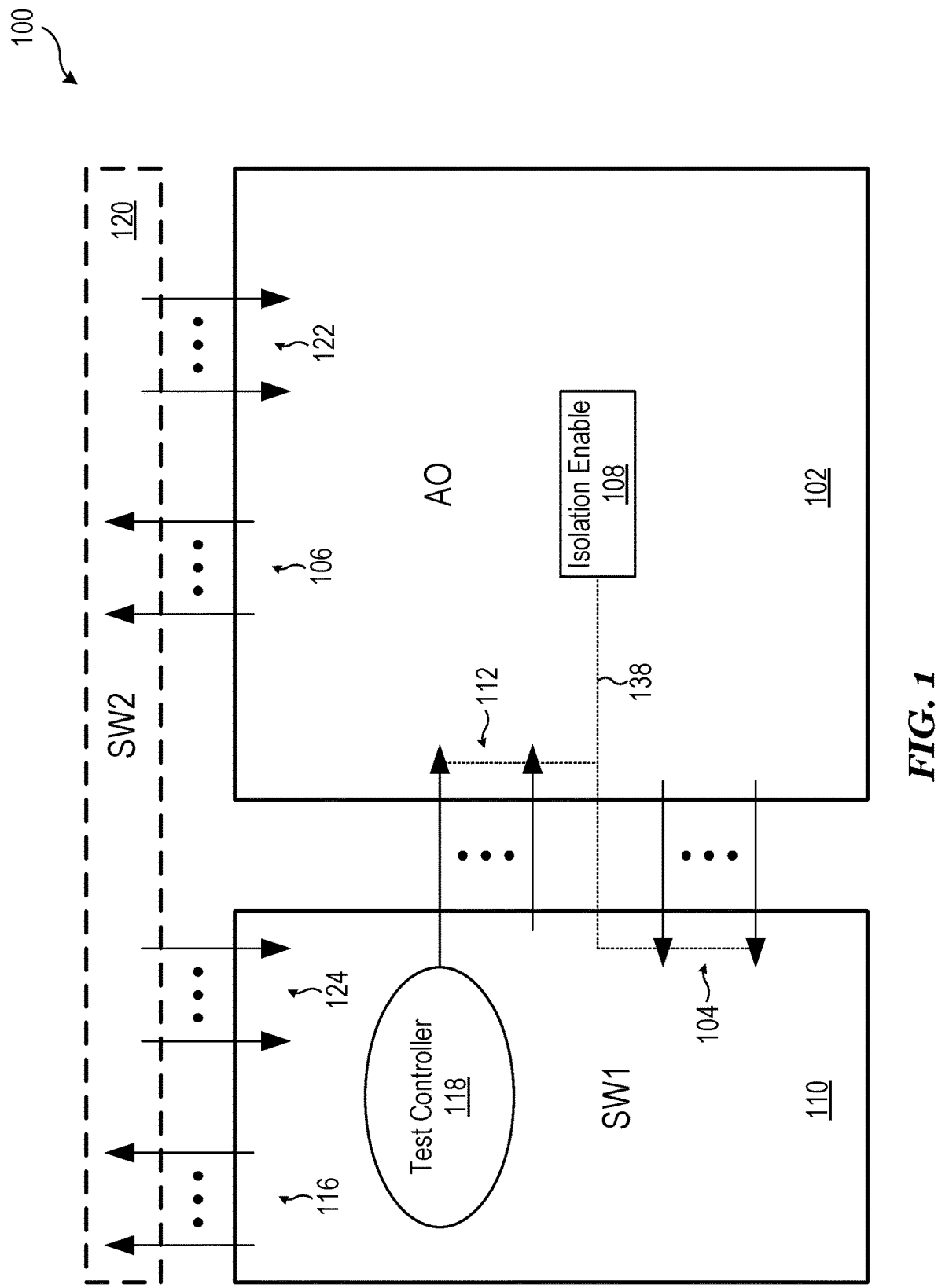
FIG. 1 illustrates a schematic diagram of a multiple power domain device with an always-on power domain that includes an isolation enable circuit, and a switchable power domain that includes a test controller.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Multiple power domains may be utilized for a variety of reasons in modern circuit design. For example, different functional circuit blocks in a single device may operate at different voltage levels or at different times. These different functional blocks may be logically organized into power domains that may include a single intellectual property (IP) core or multiple IP cores. When a power domain of a multiple power domain device is configured to remain in a powered state at all times that the device is receiving power, the power domain may be referred to as an always-on domain. In contrast, a power domain of a multiple power domain device that is configured to be switched between a powered state and an unpowered state while the device continuously receives power may be referred to as a switchable domain.

Power domains may consist of any number or combination of different circuits integrated in the same chip, different IP cores in an SoC, different chips in a system-in-package (SiP), etc. For example, SoCs that implement multiple power domains may include features such as always-on/standby modes and find applications in automotive grade devices, safety application devices, and other devices that combine analog circuits, digital circuits, and mixed circuits into a single system.

Improper functioning of isolation enable signals between power domains may have negative consequences on device functionality. For example, power consumption of the device can be increased and device malfunctions may occur if signals from unpowered domains are allowed to pass through isolation. Alternatively, if signals such as reset signals are not properly allowed to pass through isolation the switchable power domains may not be reset (e.g. after low power exit, standby exit, etc.) resulting in unknown device states. Although possible, detecting isolation enable faults from negative device performance is impractical.

Functional patterns may not cover all possible faults involving signals that pass through isolation between switchable power domains (e.g. isolation cell enable faults). For example, a test controller located in one power domain may send signals into a second power domain during testing. In order to test the second power domain, the isolation enable value may be fixed to allow the signals to pass through. Therefore, the capability of the isolation enable to be turned off (i.e. disallow signals to pass through) would not be testable.

Relying solely on functional patterns can also lead to missing coverage due to a given tester setup not supporting all device power-up configurations. Such instances may occur when components are externally placed relative to the multiple power domains being tested. Yet, even if functional patterns could enable coverage of isolation enable faults, functional patterns disadvantageously increase test time.

Additional shortcomings of conventional test methods for chips with multiple power domains exist when core wrapping is employed (e.g. for SoCs). Wrapped cores can be checked in two modes: INTEST where core logic is tested and EXTEST where the core integration within the SoC is tested. Input and output signals of a wrapped core that pass through isolation may be tested in EXTEST mode. However, the isolation enable function itself remains untested since it is generated from logic in the core that is not in the EXTEST scan and is in a static state (e.g. reset state of a flip-flop). Yet INTEST mode also does not provide isolation enable fault test coverage because the interface between the core and other domains is not checked during INTEST.

In various embodiments, a multiple power domain device includes an always-on power domain and a switchable power domain. At least some of the inputs of the always-on power domain configured to receive output signals of the switchable power domain pass through isolation cells that may be enabled to prevent propagation of the output signals (e.g. when the switchable domain is unpowered) or disabled to allow propagation of the output signals into the always-on power domain (e.g. when both domains are powered). A test controller is included within the switchable power domain. The test controller is coupled to a non-scan test data register included within the always-on power domain.

The embodiments disclosed herein may have various advantages over conventional methods, devices, and systems used for testing devices with multiple power domains. For example, both stuck-at 0 and stuck-at 1 faults may be advantageously detectable for all isolation cell enables. The isolation enable faults are detected through ATPG techniques that may also beneficially reduce required testing time when compared with pure functional pattern testing. Further, the embodiments herein may also carry the advantage of providing the desired isolation enable test coverage at all testing temperatures (i.e. both cold and hot testing regimes).

Figure 6:
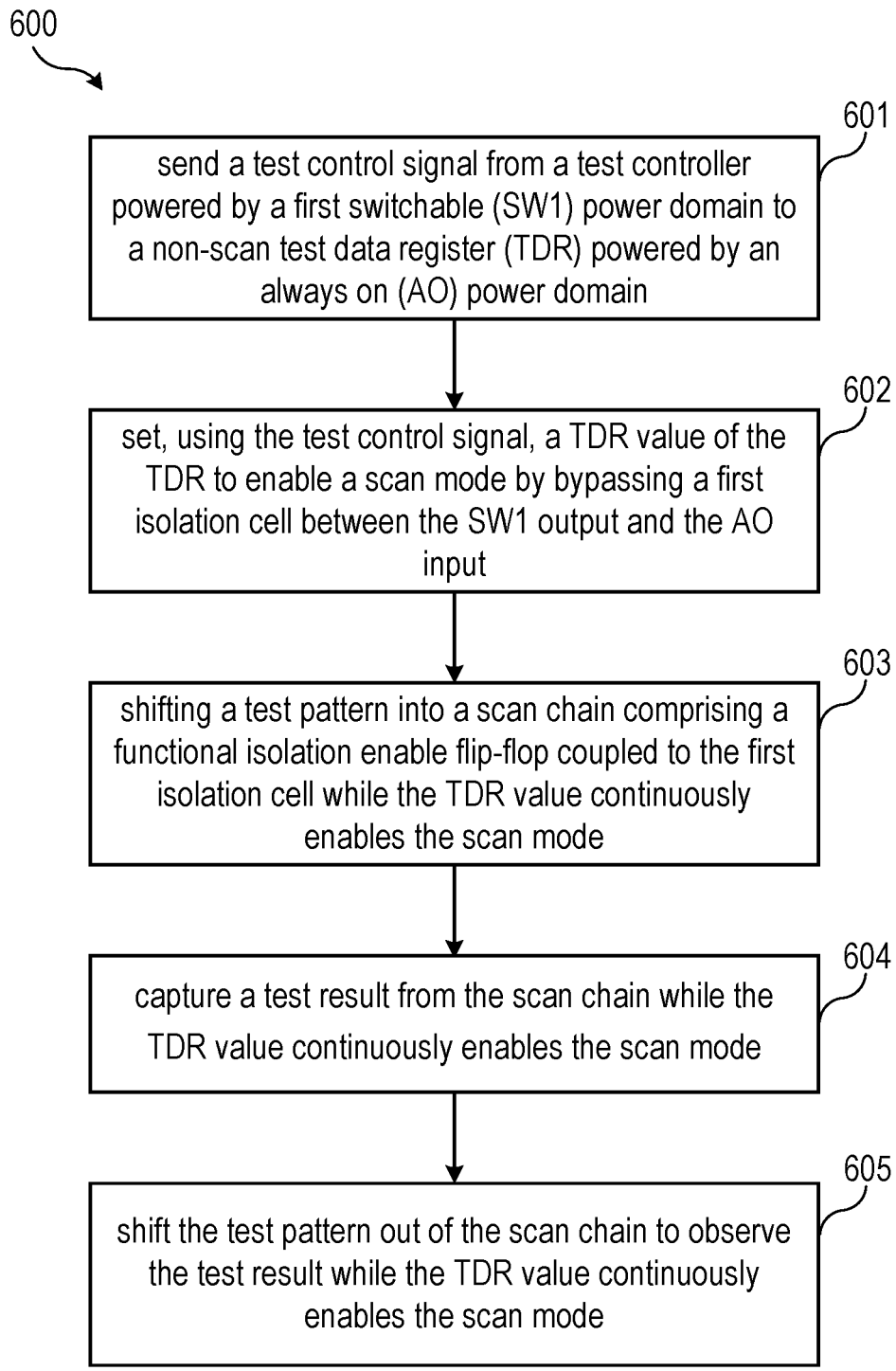
FIG. 6 illustrates an example method of testing a multiple power domain device that does not have a core wrapped AO domain in accordance with an embodiment of the invention.
Figure 7:
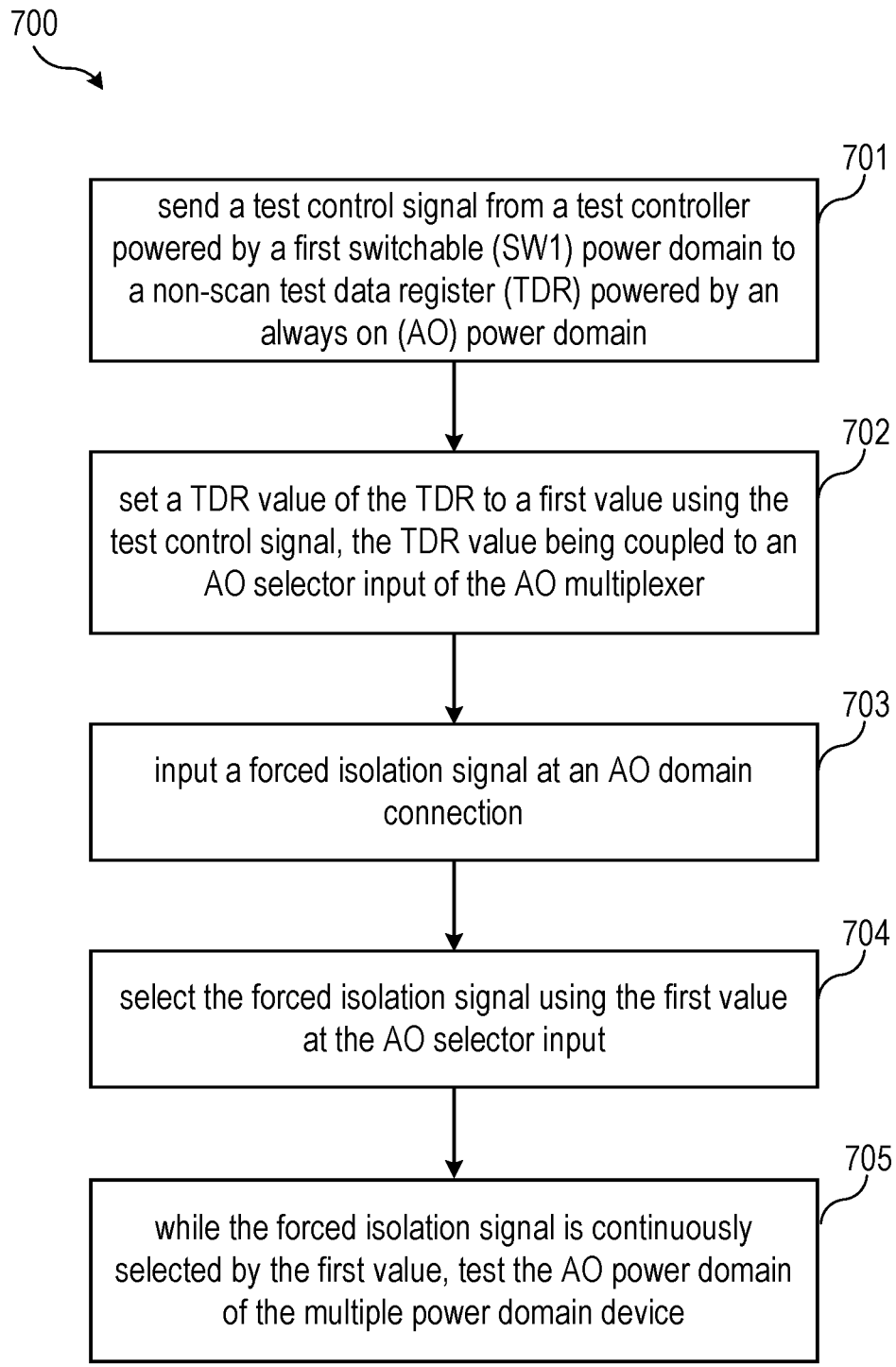
FIG. 7 illustrates another example method of testing a multiple power domain device with a core wrapped AO domain in accordance with an embodiment of the invention.

Embodiments provided below describe various methods, devices, and systems to test for isolation enable faults in devices and systems including multiple power domains, and in particular, methods, devices, and systems that include a test controller within a switchable power domain coupled to a non-scan test data register within an always-on power domain. The following description describes the embodiments. An example multiple power domain device including an always-on power domain and a switchable power domain is described using FIG. 1. An example multiple power domain device that includes an always-on power domain and a switchable power domain, the always-on domain having a first isolation enable circuit, a power-on-reset circuit, and external connections while the switchable domain has a test controller coupled to the external connects is described using FIG. 2. Three embodiment multiple power domain devices including a non-scan test data register within an always-on power domain are described using FIGS. 3, 4 and 5 while FIGS. 6 and 7 are used to describe two embodiment methods of testing a multiple power domain device. A method of entering and exiting a low power state by an embodiment multiple power domain device is described using FIG. 8. A method of entering and exiting a standby state by an embodiment multiple power domain device is described using FIG. 9. Two more embodiment methods of testing a multiple power domain device are described using FIGS. 10 and 11.

FIG. 1 illustrates a schematic diagram of a multiple power domain device with an always-on power domain that includes an isolation enable circuit, and a switchable power domain that includes a test controller. The multiple power domain device of FIG. 1 is intended to be an example suitable configuration for embodiments as described herein. However, other suitable configurations including more or fewer power domains may also be apparent to those of skill in the art in view of the examples described herein.

Referring to FIG. 1, a multiple power domain device 100 includes an always-on power domain (AO domain 102), a first switchable power domain (SW1 domain 110), and an optional second switchable power domain (SW2 domain 120). The multiple power domain device 100 may be a monolithic integrated circuit (IC), an SoC, an SiP, printed circuit board, or any other suitable electronic device. Some or all of the power domains of the multiple power domain device 100 may be core wrapped to simplify testing procedures (e.g. for large SoCs). In one embodiment, the AO domain 102 is core wrapped.

The AO domain 102 is configured to be in a powered state at all times that the multiple power domain device 100 is powered. The AO domain 102 may have any functionality, but in various embodiments the functionality the AO domain 102 is such that its continuous powered state is desirable. For example, the AO domain 102 may perform significant support tasks for the multiple power domain device 100 that are always needed. In some embodiments, the AO domain 102 includes an analog IP and includes a power management unit (PMU) in one embodiment. The PMU may include embedded voltage regulators, power management control logic and the like, Of course, the AO domain 102 may also include a digital IP, a mixed-signal IP, include multiple IPs or varying types, etc.

The SW1 domain 110 and the SW2 domain 120 are each configured to be switched between a powered state and an unpowered state while the multiple power domain device 100 continuously receives power. In one embodiment, the SW1 domain 110 is configured to be the main domain of the multiple power domain device 100. For example, the SW1 domain 110 may be a digital IP such as a processing unit. In one embodiment, the SW1 domain 110 is a microprocessor. Performance may be of higher importance for the SW1 domain 110 in comparison to the AO domain 102. For example, the SW1 domain 110 may run at higher clock frequencies and draw a larger current than the AO domain 102.

In one embodiment, the SW2 domain 120 is configured to be a low power (LP) domain of the multiple power domain device 100. Similar to the SW1 domain 110, the SW2 domain 120 is configured to a switchable domain. In contrast to the SW1 domain 110, when the SW2 domain 120 is configured as an LP domain, the SW2 domain 120 may be configured to play a support role for the multiple power domain device 100. Specifically, the SW2 domain 120 performance may less important for the SW2 domain 120 than for the SW1 domain 110. Consequently, the SW2 domain 120 may run at lower clock frequencies and draw a smaller current than the SW1 domain 110.

In particular, the multiple power domain device 100 may have a standby feature. When the multiple power domain device 100 is in standby mode, the AO domain 102 remains on because the AO domain 102 is always on. However, both the SW1 domain 110 and the SW2 domain 120 may be switched off in order to conserve power. When the multiple power domain device 100 is not in standby mode, intensive primary processing tasks may be handled by the SW1 domain 110 in run mode. The SW1 domain 110 may be turned off when not in run mode. Support tasks may be handled by the SW2 domain 120 and may occur both in or out of run mode. Therefore, the SW2 domain 120 may be on or off regardless of the status of run mode. In some cases, the SW2 domain 120 may always be on when the SW1 domain 110 is on (i.e. during run mode), but this is not a requirement.

The multiple power domain device 100 includes various signals passing between the AO domain 102, the SW1 domain 110, and the SW2 domain 120. For example, the AO domain 102 includes output signals that pass from the AO domain 102 to the SW1 domain 110 (AO-SW1 signals 104) and output signals that pass from the AO domain 102 to the SW2 domain 120 (AO-SW2 signal 106). The AO domain 102 also receives input signals from the SW1 domain 110 (SW1-AO signals 112) as well as input signals from the SW2 domain 120 (SW2-AO signals 122). Similarly, input and output signals may pass between the SW1 domain 110 and the SW2 domain 120 (SW1-SW2 signals 116 and SW2-SW1 signals 124). It should be noted that while illustrated as groups of multiple signals, any of these signals may be a single signal in some applications.

Some or all of the input and output signals between power domains may pass through isolation cells that may be enabled/disabled to prevent/allow signals to pass between different power domains. For instance, isolation cells between power domains may be desirable when one or both of the power domains is switchable since the output signals of an unpowered domain are not deterministic. That is, the inputs of a powered domain can be infected with 'X' values from unpowered domains if signals are allowed to propagate across the boundary.

Isolation cells may not always be included for output signals from the AO domain 102 because the AO domain 102 is not allowed to be in an unpowered state. However, it may still be desirable for some output signals from the AO domain 102 (e.g. reset signals) to pass through isolation cells. Isolation cells may be enabled when a power domain supplying signals is unpowered. Isolation cells may be disabled allowing signals to cross over between two power domains when both domains are powered.

An isolation enable circuit 108 is included in the AO domain 102 and is configured to output an isolation enable signal 138 to isolation cells of one or more of the AO-SW1 signals 104 and the SW1-AO signals 112. For example, when the isolation enable signal 138 is enabled the AO-SW1 signals 104 and the SW1-AO signals 112 may be prevented from propagating between the AO domain 102 and the SW1 domain 1. The isolation enable circuit 108 may also be connected to the AO-SW2 signals 106 and the SW2-AO signals 122. Alternatively, isolation may be implemented for the AO-SW2 signals 106 and the SW2-AO signals 122 using a different isolation enable circuit.

Isolation cells may be implemented in various ways. In one embodiment, each signal passes through an isolation cell comprising a tri-state buffer. In some cases, (e.g. when power domains operate at different voltage levels), isolation cells may be combined with level shifters. Isolation cells may be as simple as a single logic gate with one input receiving the signal and the other input connected to an isolation enable circuit (controlling value). Choice of logic type may impact isolation enable circuit output. For example, the isolation enable signal to enable isolation may be '1' if OR gates are used and may be '0' if AND gates are used.

Inputs and outputs are illustrated as being in the respective power domains for conceptual clarity. However, practically speaking, isolation circuitry may exist in a specific power domain (as opposed to between or bridging power domains). For example, isolation cells may be powered by (and therefore be within) the power domain that includes the isolation enable circuit. For example, isolation cells for the isolation of signals between the AO domain 102 and the SW1 domain 110 may be within the AO domain 102.

A test controller 118 is included in the SW1 domain 110. Access to test functionality and hardware (e.g. registers) may be provided by the test controller 118. In one embodiment, the test controller 118 is a JTAG test controller. The test controller 118 is configured to enable testing of the AO domain 102. The test controller 118 may be included in the SW1 domain 110 rather than the AO domain 102 to preserve lower power consumption of the AO domain 102 (e.g. the AO domain 102 may draw only 2 mA while the SW1 domain 110 may draw 5 A). Additionally, providing a single test controller in one power domain may be more economical than including a test controller for every power domain.

The test controller 118 is configured to provide an interface between the multiple power domain device 100 and external testing equipment. The external testing equipment may not provide power to the multiple power domain device 100 during testing. For example, the external testing equipment may not include any switched-mode power supply (SMPS) components.

However, signals from the test controller 118 are part of the SW1-AO signals 112 and pass through isolation cells between the AO domain 102 and the SW1 domain 110. Therefore, during testing, the isolation enable signal 138 continuously allows the SW1-AO signals 112 to pass into the AO domain 102. Consequently, the ability of the isolation enable circuit 108 to enable the isolation cells using the isolation enable signal 138 remains untested.

Isolation cell enable faults may only be covered in some functional patterns (e.g. LP domain entry/exit and AO domain entry/exit patterns). For example, if the isolation enable signal 138 is always '1' (allowing signals from unpowered switchable domains), the output of the isolation enable circuit 108 is unknown. Relying only on functional patterns can lead to missing coverage due to tester setup not supporting all device power-up configurations.

As a specific example, multiple power domains may only be present in internal regulator mode, but components might be externally placed (e.g. external metal-oxide-semiconductor (MOS) transistors, inductors, capacitors, etc. for SMPS and external bipolar junction transistor in linear regulators). However, the external components may not be available to the test equipment (e.g. at cold testing phases such as electronic wafer sort) leading to missing coverage.

Figure 2:
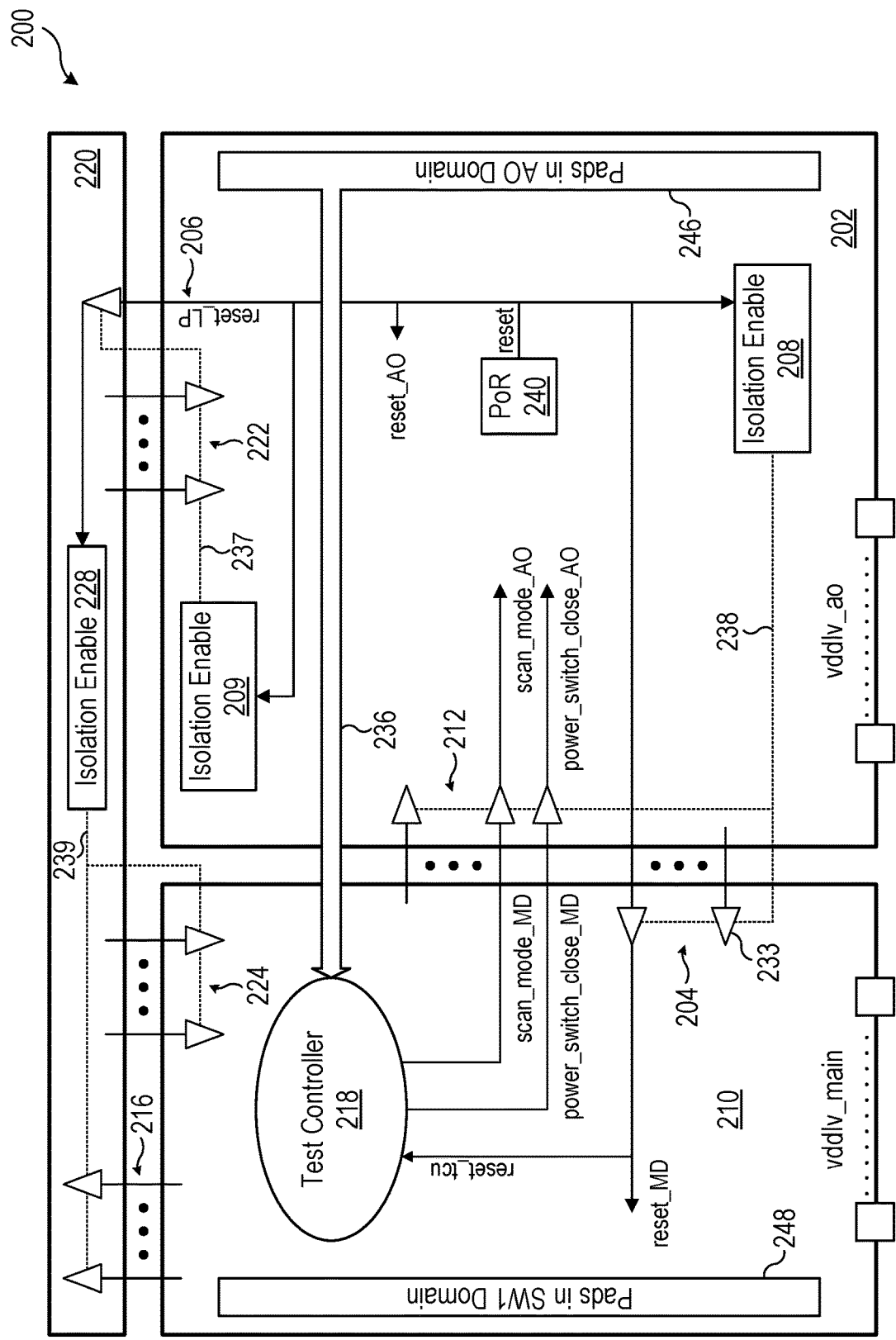
FIG. 2 illustrates a schematic diagram of a multiple power domain device with an always-on power domain that includes a first isolation enable circuit, a power-on-reset circuit, and external connections, and a first switchable power domain that includes a test controller coupled to the external connects.

FIG. 2 illustrates a schematic diagram of a multiple power domain device with an always-on power domain that includes a first isolation enable circuit, a power-on-reset circuit, and external connections, and a first switchable power domain that includes a test controller coupled to the external connects. FIG. 2 may be a specific implementation of other multiple power domain devices described herein such as the multiple power domain device of FIG. 1, for example.

Referring to FIG. 2, a multiple power domain device 200 includes an AO domain 202, an SW1 domain 210, and an SW2 domain 220. It should be noted that here and in the following a convention has been adopted for brevity and clarity wherein elements adhering to the pattern x02 may be related implementations of an AO domain in various embodiments. For example, AO domain 202 may be similar to AO domain 102 except as otherwise stated. An analogous convention has also been adopted for other elements as made clear by the use of similar terms in conjunction with the aforementioned three-digit numbering system.

The AO domain 202 outputs AO-SW1 signals 204 and AO-SW2 signals 206 while receiving SW1-AO signals 212 and SW2-AO signals 222 as inputs. An AO-SW1 isolation enable circuit 208, an AO-SW2 isolation enable circuit 209, a power-on-reset (PoR) circuit 240, and AO domain connections 246 (e.g. pads, contacts, pins, etc.) are included in the AO domain 202 which may receive power from AO power connections (vddlv_ao).

The AO-SW1 isolation enable circuit 208 outputs an AO-SW1 isolation enable signal 238 to isolation cells 233 through which the AO-SW1 signals 204 and the SW1-AO signals 212 pass while the AO-SW2 isolation enable circuit 209 outputs an AO-SW2 isolation enable signal 237 to isolation cells 233 through which the AO-SW2 signals 206 and the SW2-AO signals 222 pass. When the AO-SW1 isolation enable signal 238 or the AO-SW2 isolation enable signal 237 triggers the corresponding isolation cells 233 to be enabled, signals do not pass into or out of the AO domain 202 through them. In the same way, when the AO-SW1 isolation enable signal 238 or the AO-SW2 isolation enable signal 237 triggers the corresponding isolation cells 233 to be disabled, the signals pass freely through the isolation.

Since the SW1 domain 210 and the SW2 domain 220 are both switchable domains, SW1-SW2 signals 216 and SW2-SW1 signals 224 also pass through the isolation cells 233 as shown. An SW2-SW1 isolation enable circuit 228 sends an SW2-SW1 isolation enable signal 239 to the isolation cells 233 to enable/disable signal propagation between the SW1 domain 210 and the SW2 domain 220.

The SW1 domain 210 may receive power from SW1 power connections (vddlv_main). A test controller 218 and SW1 domain connections 248 are included in the SW1 domain 210. The test controller 218 is configured to enable testing of the AO domain 202. The test controller 218 may also be configured to facilitate testing of other domains and circuits of the multiple power domain device 200. Some tester setups may not have external SMPS components which may lead to missing coverage when only using functional patterns.

The test controller 218 outputs a power switch close signal (power_switch_close_MD as SW1 output and power_switch_close_AO as AO input after traveling through isolation) and a scan mode signal (scan_mode_MD as SW1 output and scan_mode_AO as AO input after traveling through isolation) which is included in the SW1-AO signals 212 as shown. The test controller 218 receives test controller inputs 236 from the AO domain connections 246 in the AO domain 202 which do not pass through isolation.

The scan mode signal and/or the power switch close signal may be scan critical. For instance, the scan mode signal may be configured to place the multiple power domain device 200 in scan mode (i.e. for testing). In some cases, the scan mode signal may place only portions of the multiple power domain device in scan mode (e.g. AO domain 202) such as if more than one test controller exists in the multiple power domain device 200.

PoR circuit 240 outputs a reset signal when the AO domain 202 receives power after being unpowered (e.g. being switched on, restarted, etc.). The reset signal is sent to various domains and circuits in the multiple power domain device 200 so that they will begin in a known state. For example, as shown, the reset signal of PoR circuit 240 resets the AO domain 202 (reset_AO) and is output to both the SW1 domain 210 (reset_MD) and the SW2 domain 220 (reset_LP). Within the AO domain 202 the reset signal is used to reset the AO-SW1 isolation enable circuit 208 and the AO-SW2 isolation enable circuit 209. Similarly, the reset signal is used to reset the test controller 218 (reset_tcu) within the SW1 domain 210 and the SW2-SW1 isolation enable circuit 228 within the SW2 domain 220.

Although not all output signals from the AO domain 202 pass through isolation (e.g. because the AO domain 202 is not switchable), the reset signals pass through the isolation cells 233. For example, reset signals from a powered domain to an unpowered domain may remain enabled until the unpowered domain gets a new reset when it powers up again. If isolation is enabled for signals of PoR circuit 240 from the AO domain 202 going to the SW1 domain 210 during ATPG then the test controller 218 will get reset and ATPG mode will be exited.

In various embodiments, core wrapping is implemented for the AO domain 202. For example, the AO domain 202 may be an IP core of the multiple power domain device 200 (e.g. in an SoC) that has registers accessible during testing at some or all of its inputs/outputs. Each register may be implemented as a flip-flop (FF) as part of a scan chain.

The core wrapping method is a common strategy for ATPG in SoCs (e.g. large SoCs) that may be used to reduce the number of test patterns and simply integration testing. When a CORE is wrapped then it is checked in EXTEST and INTEST modes. The core logic may be tested while the core is in INTEST mode. When rest of the SoC is tested (e.g. the integration of the core with the SoC), the core may be in EXTEST mode.

During INTEST, the core logic may be driven by wrapper FFs of the core inputs while the results are captured on wrapper FFs outputs of the core logic. During EXTEST, both the inputs and outputs of the core can be tested along with rest of SoC. This may be facilitated by capturing inputs to the core from rest of SoC in wrapper FFs. Then, rather than testing the core logic, wrapper FFs may drive the outputs from the core to the rest of the SoC.

Isolation cells may be placed between the core inputs and inputs of wrapper FFs. For core outputs that pass through isolation, isolation cells may be placed between outputs of wrapper FFs and core outputs. The isolation enable signals for the isolation cells may be driven by an FF within the core logic. For example, the AO-SW1 isolation enable circuit 208 may be implemented as a functional FF within core logic of the AO domain 202 when core wrapping is employed.

It should be noted that not all inputs and outputs of a wrapped core will be wrapped. For instance, it may be desirable for unwrapped inputs and outputs to be static during ATPG or static during shift and/or capture. These may include a scan mode bit, scan mode controls, connections (e.g. pads) controlled from ATPG pattern generation scripts, and non scan test data registers (TDRs). For example, outputs from the test controller 218 received by the AO domain 202 may not be wrapped when using core wrapping for the AO domain 202.

Figure 3:
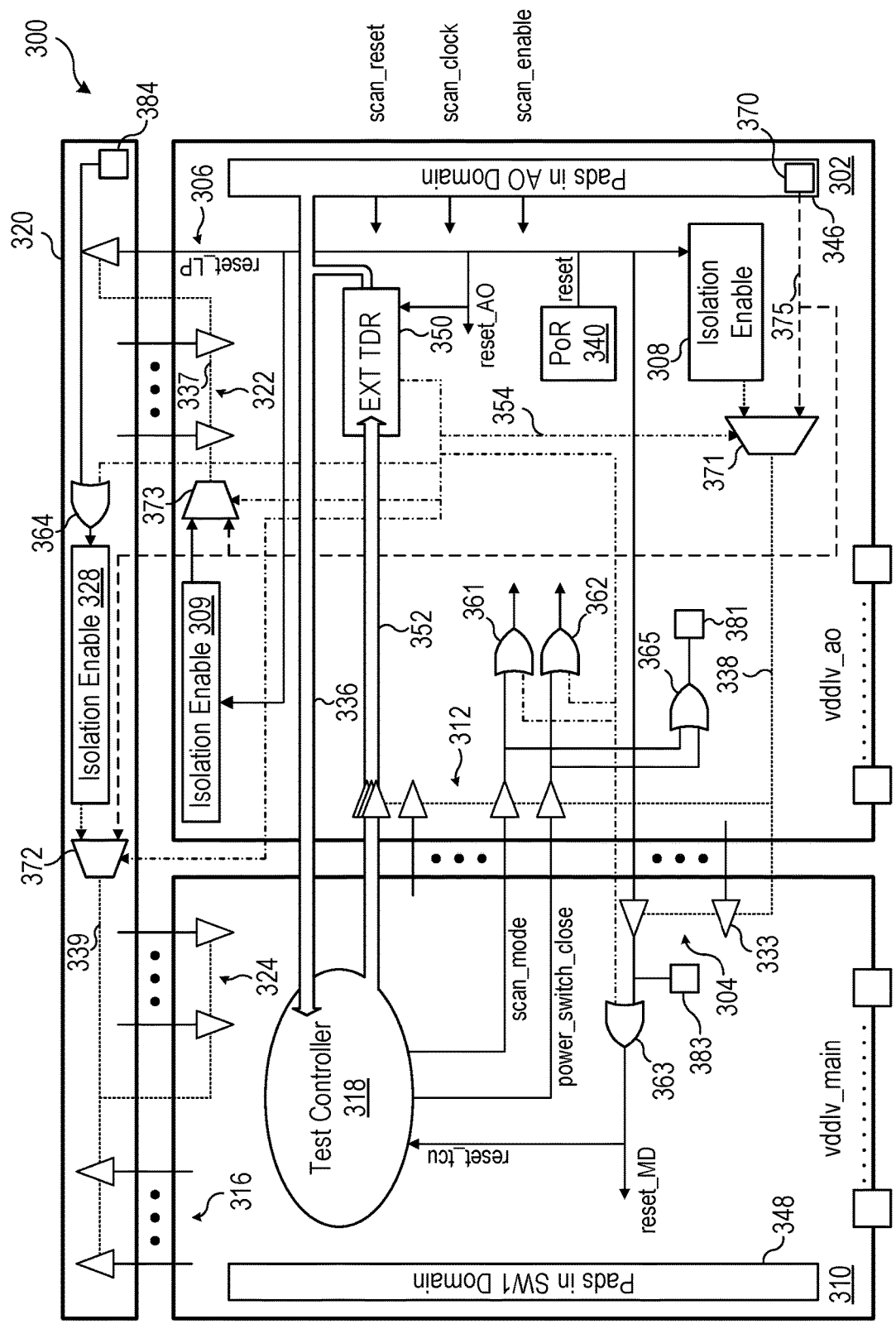
FIG. 3 illustrates a schematic diagram of a multiple power domain device with a non-scan test data register included within an always-on power domain according to an embodiment of the invention.

FIG. 3 illustrates a schematic diagram of a multiple power domain device with a non-scan test data register included within an always-on power domain according to an embodiment of the invention. FIG. 3 may be a specific implementation of other multiple power domain devices described herein such as the multiple power domain devices of FIGS. 1 and 2, as examples. Similarly labeled elements may be as previously described.

Referring to FIG. 3, a multiple power domain device 300 includes an AO domain 302, an SW1 domain 310, and an SW2 domain 320. The AO domain 302 outputs AO-SW1 signals 304 and AO-SW2 signals 306 while receiving SW1-AO signals 312 and SW2-AO signals 322 as inputs. SW1-SW2 signals 316 and SW2-SW1 signals 324 pass between the SW1 domain 310 and the SW2 domain 320.

As before, an AO-SW1 isolation enable circuit 308, an AO-SW2 isolation enable circuit 309, a power-on-reset (PoR) circuit 340, and AO domain connections 346 are included in the AO domain 302 while a test controller 318 and SW1 domain connections 348 are included in the SW1 domain 310.

The AO-SW1 isolation enable circuit 308 outputs an AO-SW1 isolation enable signal 338 to isolation cells 333 through which the AO-SW1 signals 304 and the SW1-AO signals 312 pass while the AO-SW2 isolation enable circuit 309 outputs AO-SW2 isolation enable signal 337 to isolation cells 333 through which the AO-SW2 signals 306 and the SW2-AO signals 322 pass. An SW2-SW1 isolation enable circuit 328 within the SW2 domain 320 sends an SW2-SW1 isolation enable signal 339 to the isolation cells 333 of the SW1-SW2 signals 316 and the SW2-SW1 signals 324.

As previously discussed, it may be desirable to achieve full isolation cell enable pin coverage during testing (e.g. detect both stuck-at '0' and stuck-at '1' faults) for all signals passing between all power domains (i.e. through isolation) with facile test setup and with minimal increase in testing time. It may also be desirable to achieve such testing coverage for both cold testing and hot testing regimes.

Toward these ends, an external non-scan test data register (TDR 350) is included in the AO domain 302 as shown. TDR 350 may advantageously provide isolation enable pin coverage for all the isolation cells 333 through ATPG. For example, TDR 350 may be a single bit that can accessed using the test controller 318 to set (e.g. load) the bit value using test control signals 352 allowing a TDR value 354 to be delivered to various circuits of the multiple power domain device 300.

TDR 350 may be accessed from external connections such as the AO domain connections 346 (e.g. JTAG pads) using test controller inputs 336. Specifically, in an ATPG test setup of a pass to cover isolation enable fault, TDR 350 may be loaded through JTAG from the AO domain connections 346 to set the TDR value 354 within TDR 350. In this way, the AO domain connections 346 may advantageously serve a dual purpose (reused for ATPG). In addition to the test controller inputs 336, other signals (e.g. scan_reset and scan_clock as shown) may also be provided using the AO domain connections 346.

In one embodiment, the AO domain 302 is a core wrapped IP core. For core wrapped implementations of the AO domain 302, the AO-SW1 isolation enable circuit 308 and the AO-SW2 isolation enable circuit 309 may be included in the scan chain. An AO-SW1 multiplexer 371 (MUX) is included within the AO domain 302 that receives the output of the AO-SW1 isolation enable circuit 308 as an input. An AO-SW2 multiplexer 373 is also included within the AO domain 302 that receives the output of the AO-SW2 isolation enable circuit 309 as an input.

The AO-SW1 multiplexer 371 also receives an external signal (a forced isolation signal 375) from a forced isolation input 370 allowing the value of the AO-SW1 isolation enable signal 338 to remain constant during shift and capture (e.g. isolation disabled during shift and enabled during capture). The AO-SW2 isolation enable signal 337 output by AO-SW2 multiplexer 373 is also similarly controlled by the forced isolation input 370. In one embodiment, the forced isolation input 370 is included in the AO domain connections 346 in the AO domain 302.

During functional mode, the TDR value 354 may remain static at '0' allowing reset of the test controller 318 when the AO-SW1 isolation enable signal 338 is switched on. This enables the desired behavior of the PoR circuit 340 resetting the SW1 domain 310 and the SW2 domain 320 at the multiple power domain device 300 boot and upon becoming powered again after isolation was enabled (e.g. during low power exit or standby exit).

During ATPG shift and capture in both EXTEST and INTEST modes, the TDR value 354 may remain static at '1' which selects the forced isolation signal 375 in the AO-SW1 multiplexer 371 and the AO-SW2 multiplexer 373. During ATPG capture in both EXTEST and INTEST, the AO-SW1 isolation enable signal 338 and the AO-SW2 isolation enable signal 337 may also remain constant. For example, isolation may be enabled by selecting the forced isolation signal 375.

Therefore to avoid AO domain 302 exiting scan mode during INTEST, OR gates that accept the test controller 318 signals as one input and the TDR value 354 as another input are included within the AO domain 302 (scan mode OR gate 361 and power switch OR gate 362). Consequently, the TDR value 354 is ORed with isolation cell outputs of all scan critical test signals entering the AO domain 302 so that they can remain '1' during ATPG while their isolation cells can be disabled or enabled and checked for both stuck-at 0 and stuck-at 1 faults.

This solution may be extended to other power domains. For example, similar OR gates may be included in the SW2 domain 320 in embodiments where the test controller 318 entering the SW2 domain 320 are used to test the SW2 domain 320.

The TDR value 354 is also ORed with isolation outputs of reset sources (e.g. from the PoR circuit 340 entering the SW1 domain 310 and the SW2 domain 320) using an SW1 reset OR gate 363 and an SW2 reset OR gate 364. This may afford the advantage that when ATPG mode is entered, the test controller 318 will not then undesirably exit ATPG mode when isolation is enabled since the TDR value 354 does not pass through isolation.

This may advantageously enable isolation enable faults to be checked when the core (the AO domain 302) is in EXTEST mode and INTEST mode. For example, an observational FF may be part of INTEST scan chains or may be stitched together in a scan chain with other core wrapped FFs and be checked in EXTEST mode. If the AO-SW1 multiplexer 371 were excluded, the AO-SW1 isolation enable circuit 308 could disadvantageously remove the AO domain 302 from scan mode during ATPG shift when isolation enabling values were shifted through the AO-SW1 isolation enable circuit 308 (e.g. functional FF).

Similar advantages may be gained by including an SW2 multiplexer 372 in the SW2 domain 320 with the output of the SW2-SW1 isolation enable circuit 328 and the forced isolation signal 375 as inputs. The output (the SW2-SW1 isolation enable signal 339) is selectable by using the TDR value 354 in the same manner as the AO-SW1 isolation enable signal 338 (since it originates from an always-on domain and does not pass through isolation).

During ATPG, the output of the isolation cells 333 for the scan critical signals (e.g. scan_mode, power_switch_close, etc.) may be observed at an AO observation FF 381. In one embodiment, an observation OR gate 365 is included between the scan critical signals and the AO observation FF 381 so that only one observational FF is needed. Similarly, the output of the isolation cell for the SW1 reset signal may be observed at an SW1 observation FF 383 while the output of the isolation cell for the SW2 reset signal may be observed at an SW2 observation FF 384.

Stuck-at 0 and stuck-at 1 faults may be checked through ATPG by observing isolation outputs (e.g. during ATPG capture) at the AO observation FF 381 (test signal) and functional FFs (other than the AO-SW1 isolation enable circuit 308 and AO-SW2 isolation enable circuit 309) thereby advantageously providing full isolation enable fault coverage.

In this way the isolation enable functionality for all signals can advantageously be checked for both stuck-at 0 and stuck-at 1 with decreased testing time compared to functional patterns. A further benefit may be that ATPG can be done in engineering mode (i.e. not device configuration such as the voltage regulator bypass mode (not requiring external SMPS components at tester) where the voltage regulators are within the multiple power domain device, such as an SoC (SMPS regulator providing vddlv_main to SW1, Lowpower regulator providing vddlv_lp to SW2, Ultralowpower/Standby regulator providing vddlv_ao to AO domain) are forced in powerdown and vddlv_main, vddlv_lp and vddlv_ao are provided to SW1, SW2 and AO directly from tester power supply source). In this way, coverage may advantageously be available at all temperatures where testing is done (e.g. cold testing and hot testing regimes).

Figure 4:
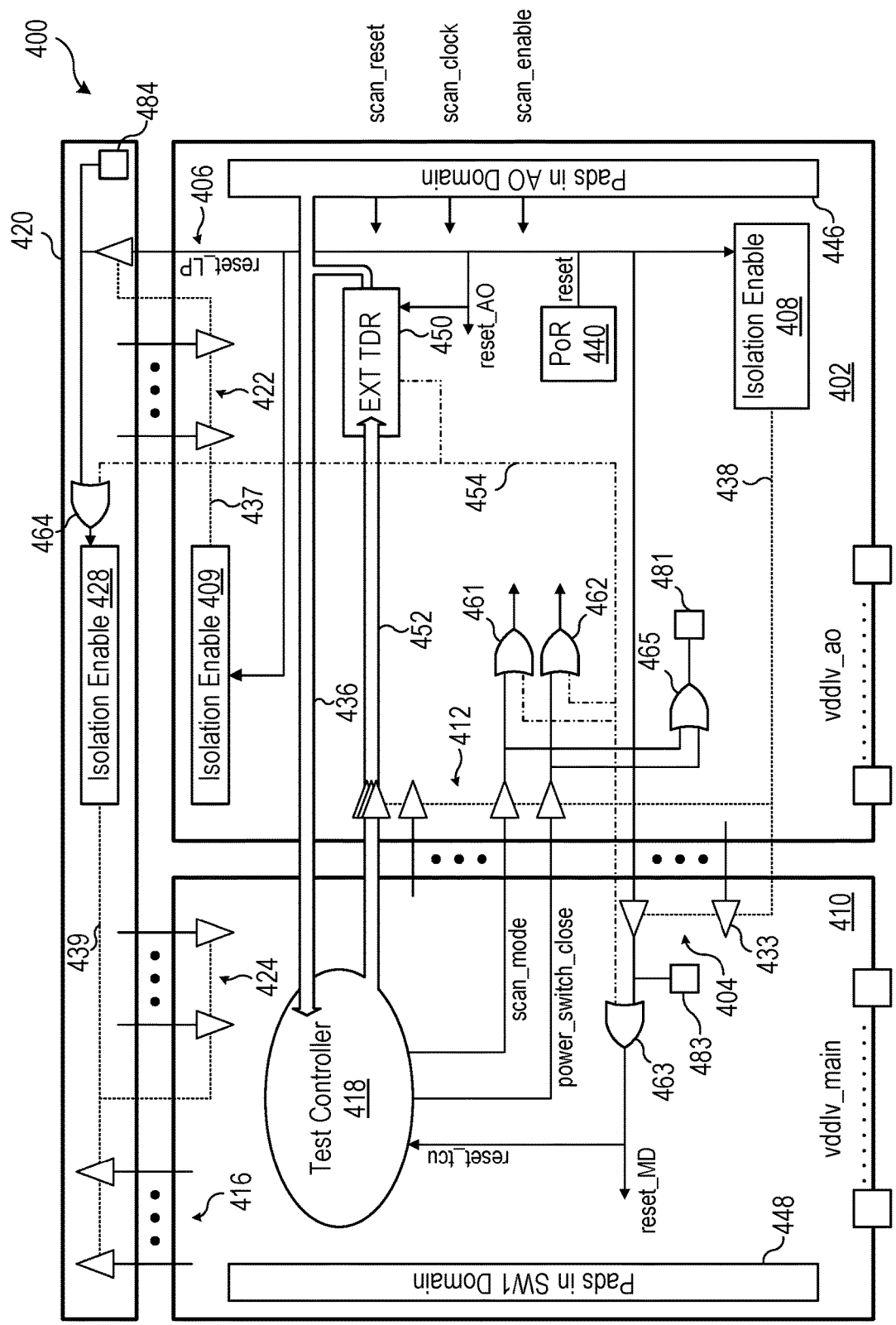
FIG. 4 illustrates a schematic diagram of another multiple power domain device with a non-scan test data register included within an always-on power domain according to an embodiment of the invention.

FIG. 4 illustrates a schematic diagram of another multiple power domain device with a non-scan test data register included within an always-on power domain according to an embodiment of the invention. FIG. 4 may be a specific implementation of other multiple power domain devices described herein such as the multiple power domain devices of FIGS. 1 and 2, as examples. Similarly labeled elements may be as previously described.

Referring to FIG. 4, a multiple power domain device 400 includes an AO domain 402, an SW1 domain 410, and an SW2 domain 420. The AO domain 402 outputs AO-SW1 signals 404 and AO-SW2 signals 406 while receiving SW1-AO signals 412 and SW2-AO signals 422 as inputs. SW1-SW2 signals 416 and SW2-SW1 signals 424 pass between the SW1 domain 410 and the SW2 domain 420.

Similar to the multiple power domain device 300, the multiple power domain device 400 also includes an AO-SW1 isolation enable circuit 408, an AO-SW2 isolation enable circuit 409, a PoR circuit 440, and AO domain connections 446 in the AO domain 402 while a test controller 418 and SW1 domain connections 448 are included in the SW1 domain 410. An AO-SW1 isolation enable signal 438 from the AO-SW1 isolation enable circuit 408, an AO-SW2 isolation enable signal 437 from the AO-SW2 isolation enable circuit 409, and an SW2-SW1 isolation enable signal 439 from an SW2-SW1 isolation enable circuit 428 are output to respective isolation cells 433 of the AO domain 402 and the SW2 domain 420.

Also similar to the multiple power domain device 300, the multiple power domain device 400 includes a TDR 450 in the AO domain 402 that may be accessed using the test controller 418 to set the bit value using test control signals 452 from test controller inputs 436 allowing a TDR value 454 to be delivered to various circuits of the multiple power domain device 400.

In one embodiment, the AO domain 402 is unwrapped (i.e. does not implement core wrapping). In this case, transparent ATPG (no EXTEST/INTEST, e.g. for small SoCs) may be used. However, scan signals still cannot be isolated with the AO-SW1 isolation enable circuit 408 as it will be driven from a scannable FF that toggles during shift and capture.

Therefore, a scan mode OR gate 461, a power switch OR gate 462, an SW1 reset OR gate 463, and an SW2 reset OR gate 464 are still included so that the scan critical signals can remain '1' during ATPG. An observation OR gate 465 and observation FFs (AO observation FF 481, SW1 observation FF 483, and SW2 observation FF 484) are also included. However, in contrast to the multiple power domain device 300, multiplexers receiving a forced isolation input are not included in the multiple power domain device 400 in the absence of core wrapping.

Figure 5:
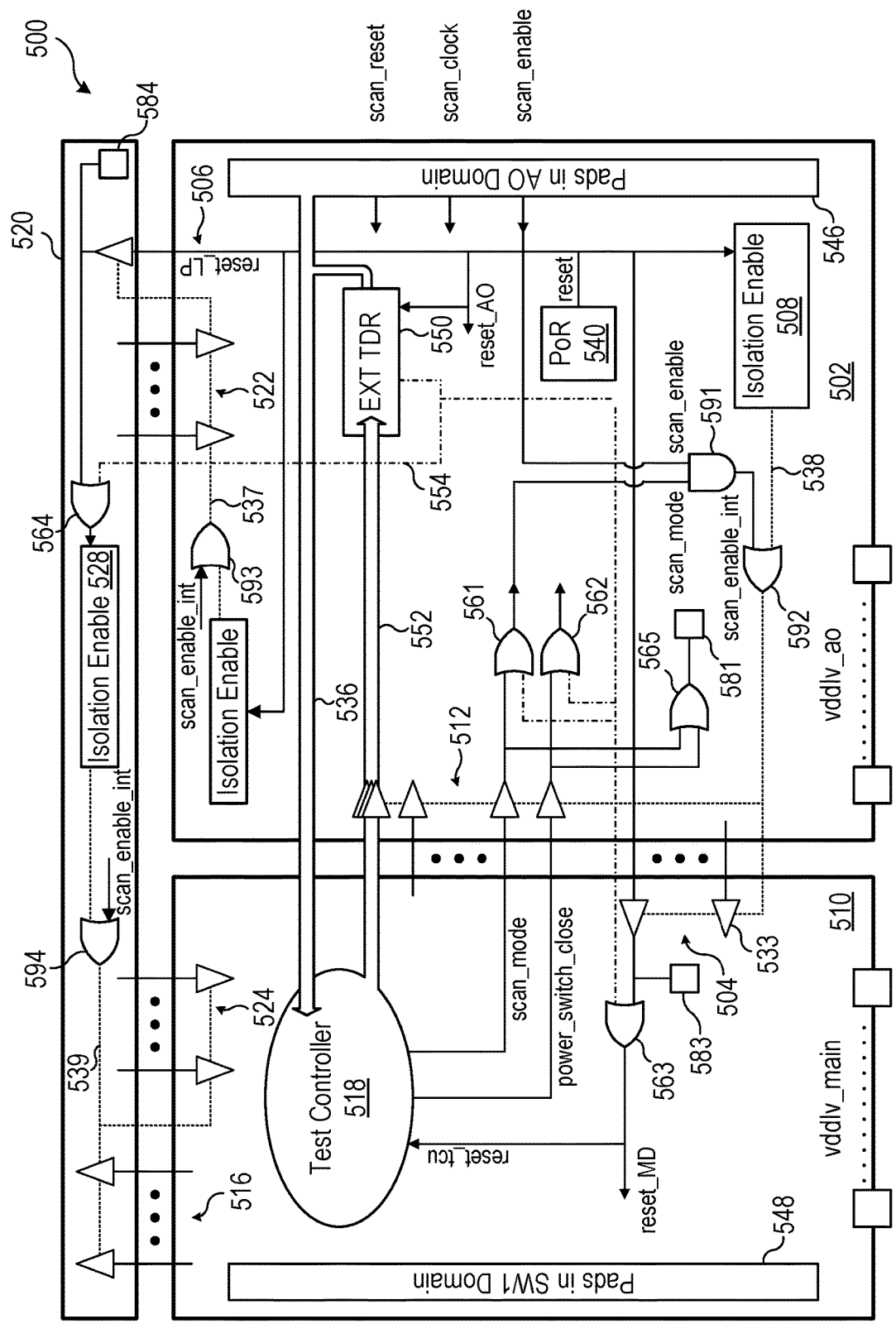
FIG. 5 illustrates a schematic diagram of yet another multiple power domain device with a non-scan test data register included within an always-on power domain according to an embodiment of the invention.

FIG. 5 illustrates a schematic diagram of yet another multiple power domain device with a non-scan test data register included within an always-on power domain according to an embodiment of the invention. FIG. 5 may be a specific implementation of other multiple power domain devices described herein such as the multiple power domain devices of FIGS. 1, 2, and 4, as examples. Similarly labeled elements may be as previously described.

Referring to FIG. 5, a multiple power domain device 500 includes an AO domain 502, an SW1 domain 510, and an SW2 domain 520. The AO domain 502 outputs AO-SW1 signals 504 and AO-SW2 signals 506 while receiving SW1-AO signals 512 and SW2-AO signals 522 as inputs. SW1-SW2 signals 516 and SW2-SW1 signals 524 pass between the SW1 domain 510 and the SW2 domain 520.

Similar to the multiple power domain device 400, the multiple power domain device 500 also includes an AO-SW1 isolation enable circuit 508, an AO-SW2 isolation enable circuit 509, a PoR circuit 540, and AO domain connections 546 in the AO domain 502 while a test controller 518 and SW1 domain connections 548 are included in the SW1 domain 510. An AO-SW1 isolation enable signal 538 from the AO-SW1 isolation enable circuit 508, an AO-SW2 isolation enable signal 537 from the AO-SW2 isolation enable circuit 509, and an SW2-SW1 isolation enable signal 539 from an SW2-SW1 isolation enable circuit 528 are output to respective isolation cells 533 of the AO domain 502 and the SW2 domain 520.

Also similar to the multiple power domain device 400, the multiple power domain device 500 includes a TDR 550 in the AO domain 502 that may be accessed using the test controller 518 to set the bit value using test control signals 552 from test controller inputs 536 allowing a TDR value 554 to be delivered to various circuits of the multiple power domain device 500.

A scan mode OR gate 561, a power switch OR gate 562, an SW1 reset OR gate 563, an SW2 reset OR gate 564, an observation OR gate 565, and observation FFs (AO observation FF 581, SW1 observation FF 583, and SW2 observation FF 584) are also still included.

However, in contrast to the multiple power domain device 400, various additional logic gates are also included in the AO domain 502 and the SW2 domain 520. Specifically, the multiple power domain device 500 includes mixed scan chains for the AO domain 502, the SW1 domain 510, and the SW2 domain 520. As shown, the multiple power domain device 500 may also not have core wrapping (similar to the multiple power domain device 400 of FIG. 4, for example).

In this configuration, the isolation cells 533 in all domains may need to be disabled while in scan mode during shift. For example, when in scan mode and during shift (scan_enable is '1'), the isolation cells 533 may receive the scan_enable signal of '1 and disabled allowing all signals to pass between domains. However, during capture in scan mode, the isolation cells 533 may need to respond to signals from isolation enable circuits (the AO-SW1 isolation enable signal 538, the AO-SW2 isolation enable signal 537, and SW2-SW1 isolation enable signal 539).

In order to facilitate this behavior, OR logic gates that receive the scan_enable_int signal (AND gate output of scan_mode and scan_enable) as a first input and an isolation enable signal as a second input may be included. In particular, an AO-SW1 isolation OR gate 592, an AO-SW2 isolation OR gate 593, and an SW2-SW1 isolation OR gate 594 are positioned in between the AO-SW1 isolation enable circuit 508, the AO-SW2 isolation enable circuit 509, and the SW2-SW1 isolation enable circuit 528 and corresponding isolation cells 533.

As can be seen from FIG. 5, the desired behavior is then achieved as the isolation cells 533 are always disabled (receiving logical '1') when the scan_enable signal is '1' and are toggled by the isolation enable signals when the scan_enable signal is '0'.

It may be important to ensure that the scan_enable signal is only allowed to control all the isolation cells 533 (between the AO domain 502 and the SW1 domain 510, between the AO domain 502 and the SW2 domain 520 and between SW2 domain 520 and the SW1 domain 510) when the scan_mode signal is also high. For this purpose, an AND gate 591 may also be included accepting the scan_mode and scan_enable signals as inputs and having an output coupled to an input of the AO-SW1 isolation OR gate 592, input of the AO-SW2 isolation OR gate 593, input of the SW2-SW1 isolation OR gate 594. This may allow, for example, a connection of the AO domain connections 546 that is used to input the scan_enable signal to be used for other purposes outside of scan mode.

FIG. 6 illustrates an example method of testing a multiple power domain device that does not have a core wrapped AO domain in accordance with an embodiment of the invention. The method of FIG. 6 may be performed using embodiment devices and systems as described herein. For example, the method of FIG. 6 may be combined with the embodiments of FIGS. 4 and 5. Arrows in FIG. 6 are intended to indicate order of the steps, but are not intended to be limiting. The below method steps may be performed in any suitable order as may be apparent to a person of skill in the art.

Referring to FIG. 6, step 601 of a method 600 is to send a test control signal from a test controller powered by a first switchable (SW1) power domain to a non-scan test data register (TDR) powered by an always on (AO) power domain. The AO power domain comprises an AO input and is configured to always receive power while the multiple power domain device is powered. The SW1 power domain comprises an SW1 output and is configured to be switched between a powered state and an unpowered state while the multiple power domain device is powered.

Step 602 is to set, using the test control signal, a TDR value of the TDR to enable a scan mode by bypassing a first isolation cell between the SW1 output and the AO input. The first isolation cell is configured to allow or disallow a first signal originating from the SW1 output to propagate through the first isolation cell to the AO input. Step 603 includes shifting a test pattern into a scan chain comprising a functional isolation enable flip-flop coupled to the first isolation cell. The shifting is performed while the TDR value continuously enables the scan mode.

Step 604 is to capture a test result from the scan chain. The capturing is performed while the TDR value continuously enables the scan mode. Step 605 is to shift the test pattern out of the scan chain to observe the test result, which is also performed while the TDR value continuously enables the scan mode.

FIG. 7 illustrates another example method of testing a multiple power domain device with a core wrapped AO domain in accordance with an embodiment of the invention. The method of FIG. 7 may be performed using embodiment devices and systems as described herein. For example, the method of FIG. 7 may be combined with the embodiments of FIGS. 1-3. Arrows in FIG. 7 are intended to indicate order of the steps, but are not intended to be limiting. The below method steps may be performed in any suitable order as may be apparent to a person of skill in the art.

Referring to FIG. 7, step 701 of a method 700 is to send a test control signal from a test controller powered by a first switchable (SW1) power domain to a non-scan test data register (TDR) powered by an always on (AO) power domain. The AO power domain comprises an AO input and core wrapped logic the AO power domain being configured to always receive power while the multiple power domain device is powered. The SW1 power domain comprises an SW1 output and is configured to be switched between a powered state and an unpowered state while the multiple power domain device is powered. The AO power domain further comprises an AO multiplexer comprising an AO multiplexer output coupled to a first isolation cell configured to allow or disallow a first signal from propagating from the SW1 output to the AO input.

Step 702 is to set a TDR value of the TDR to a first value using the test control signal, the TDR value being coupled to an AO selector input of the AO multiplexer. A forced isolation signal is input at an AO domain connection in step 703. Step 704 includes selecting the forced isolation signal using the first value at the AO selector input. Step 705 is to test the AO power domain of the multiple power domain device (e.g. in EXTEST and INTEST mode). The testing is performed while the forced isolation signal is continuously selected by the first value.

Figure 8:
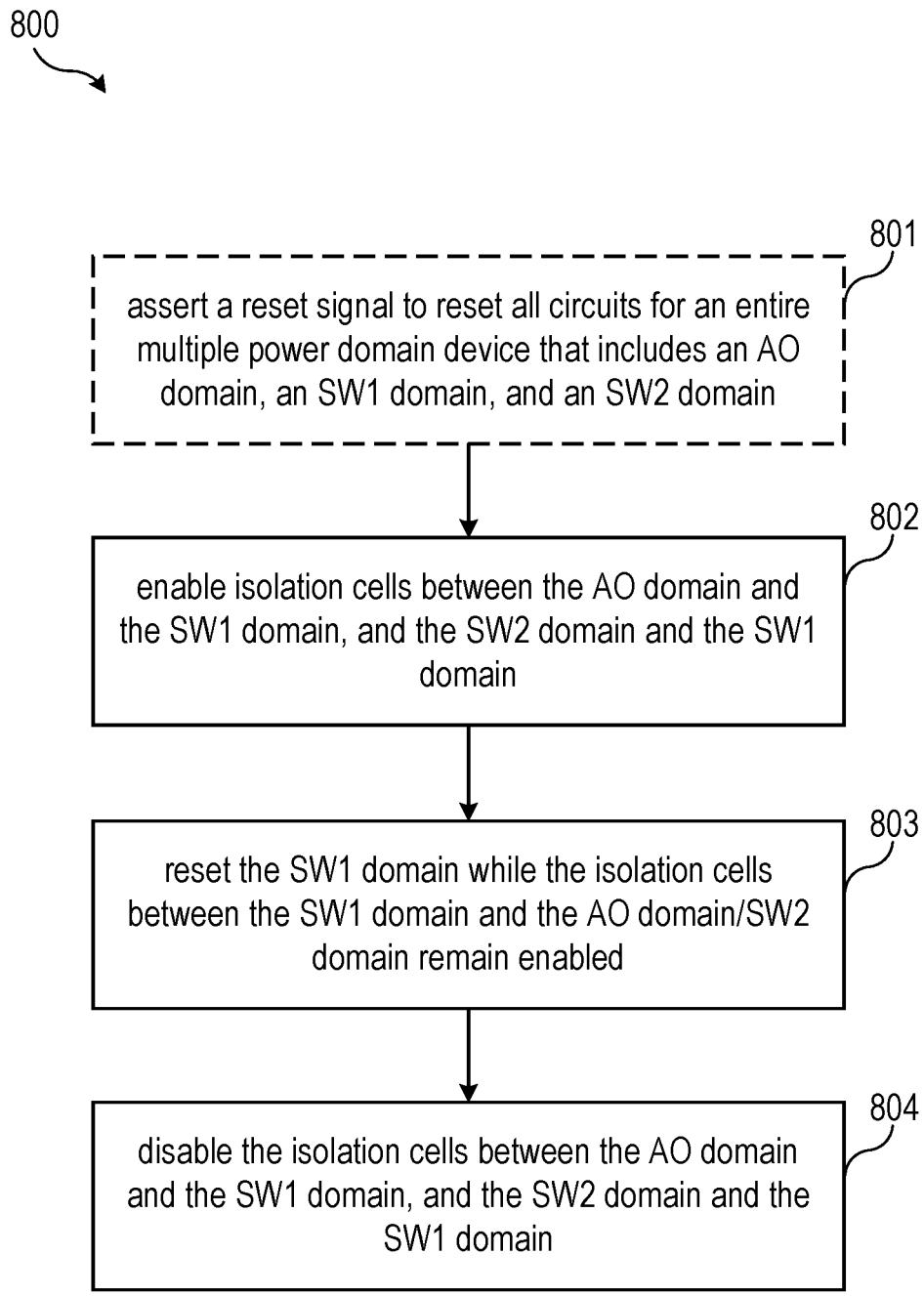
FIG. 8 illustrates an example method of entering and exiting a low power state by a multiple power domain device in accordance with an embodiment of the invention.

FIG. 8 illustrates an example method of entering and exiting a low power state by a multiple power domain device in accordance with an embodiment of the invention. The method of FIG. 8 may be performed using embodiment devices and systems as described herein. For example, the method of FIG. 8 may be combined with any of the embodiments of FIGS. 1-5. Further, the method of FIG. 8 may be combined with other methods such as the methods of FIGS. 6 and 7. For instance, the device could enter and exit a low power state before or after being tested. Arrows in FIG. 8 are intended to indicate order of the steps, but are not intended to be limiting. The below method steps may be performed in any suitable order as may be apparent to a person of skill in the art.

Referring to FIG. 8, a multiple power domain device including an AO domain, an SW1 domain, and an SW2 domain may be in a powered-off state (e.g. no power domains of the device receive power). If the device is starting in the powered-of state (e.g. power provided to all regions for the first time), step 801 of a method 800 is to assert a reset signal (e.g. from a PoR circuit) to reset all circuits (e.g. flip-flops) for the entire device (i.e. AO, SW1, SW2, etc.). Optionally, if the device is already fully powered, step 801 may be omitted.

This stage may be a boot phase of the device. During step 801 all of the isolation cells between all domains may be disabled (i.e. to allow all signals to pass through isolation). That is, all isolation enable circuits may be forced to '1' to allow the signals to propagate.

At some time following the reset of all circuits and while all domains the multiple power domain device receive power, the reset signal is deasserted. The AO domain, the SW1 domain, and the SW2 domain are then out of reset (e.g. the boot phase is completed). All of the isolation cells remain disabled.

The multiple power domain device then initiates an entry sequence in order to enter a low power state of the device. The entry sequence includes a step 802 of enabling the isolation cells (disallowing signals to pass through) between the AO domain and the SW1 domain and the SW2 domain and the SW1 domain. That is, an AO-SW1 isolation enable circuit powered by the AO domain and an SW2-SW1 isolation enable circuit powered by the SW2 domain may both be may be forced to '0' to prevent signals from leaving the SW1 domain.

After the isolation cells are enabled in step 802, the SW1 domain is reset. At some time following the reset of the SW1 domain, power is removed from the SW1 domain and it enters an unpowered state. The isolation cells controlling the passage of signals from the SW1 domain to both AO domain and the SW2 domain are enabled at all times that the SW1 domain is unpowered.

Once the SW1 domain is unpowered, the multiple power domain device is in the low power state. Specifically, the AO domain and the SW2 domain remain powered and signals may pass between these powered domains, but the SW1 is unpowered and no signals can pass from the SW1 domain to either the AO domain or the SW2 domain.

At such time as the multiple power domain device seeks to exit the low power state, an exit sequence is initiated to transition the SW1 domain from the unpowered state to the powered state. The exit sequence includes a step 803 of resetting the SW1 domain while the isolation cells between the SW1 domain and both the AO domain and the SW2 domain remain enabled. The SW1 domain receives power and the isolation cells remain enabled while SW1 domain is in reset.

Once the SW1 domain is reset and is receiving power, the device exits the low power state and disables the isolation cells (allowing signals to pass through) between the AO domain and the SW1 domain and the SW2 domain and the SW1 domain in step 804. The SW1 domain is out of reset as the PoR circuit in AO domain remains deasserted.

Figure 9:
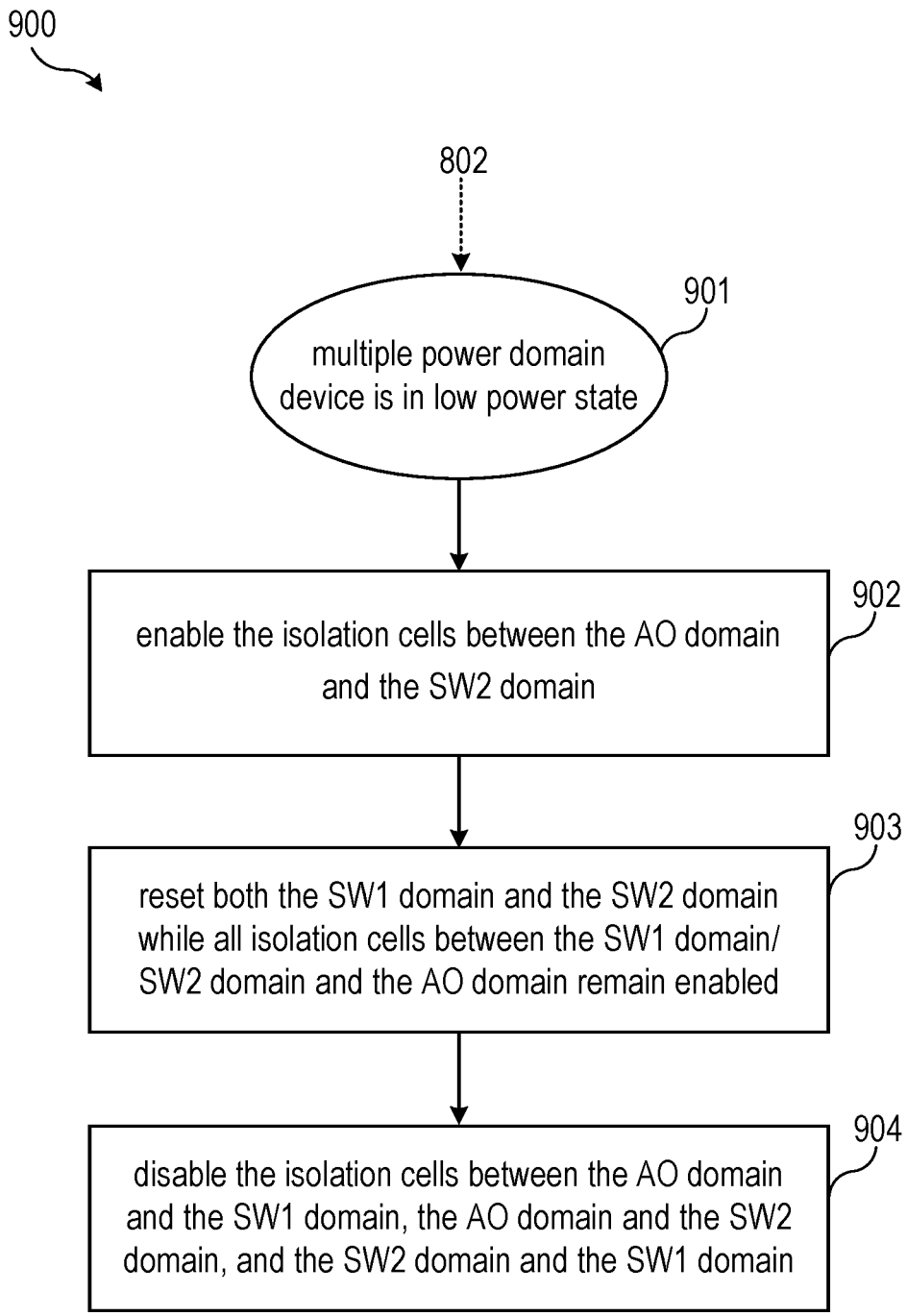
FIG. 9 illustrates an example method of entering and exiting a standby state by a multiple power domain device in accordance with an embodiment of the invention.

FIG. 9 illustrates an example method of entering and exiting a standby state by a multiple power domain device in accordance with an embodiment of the invention. The method of FIG. 9 may be performed using embodiment devices and systems as described herein. For example, the method of FIG. 9 may be combined with any of the embodiments of FIGS. 1-5. Further, the method of FIG. 9 may be combined with other methods such as the methods of FIGS. 6 and 7. For instance, the device could enter and exit a standby state before or after being tested. Arrows in FIG. 9 are intended to indicate order of the steps, but are not intended to be limiting. The below method steps may be performed in any suitable order as may be apparent to a person of skill in the art.

Referring to FIG. 9, a method 900 begins with a multiple power domain device including an AO domain, an SW1 domain, and an SW2 domain being in a low power state 901. In particular, as shown, the device may have just performed step 802 (as in method 800) so that the SW1 domain is unpowered, and the AO-SW1 isolation enable circuit and an SW2-SW1 isolation enable circuit remain both forced to 'o' to prevent from leaving the SW1 domain (isolation cells enabled).

From the low power state, the multiple power domain device initiates an entry sequence in order to enter a standby state (e.g. a functional standby state). The entry sequence includes step 902 of enabling the isolation cells (disallowing signals to pass through) between the AO domain and the SW2 domain. That is, an AO-SW2 isolation enable circuit powered by the AO domain may be forced to 'o' to prevent signals from leaving the SW2 domain.

After the isolation cells are enabled in step 902, the SW2 domain is reset. At some time following the reset of the SW2 domain, power is removed from the SW2 domain and it enters an unpowered state. The isolation cells controlling the passage of signals from the SW2 domain to the AO domain are enabled at all times that the SW2 domain is unpowered.

Once the SW2 domain is unpowered, the multiple power domain device is in the standby state. Specifically, the AO domain remains powered, but the SW1 domain and the SW2 domain are unpowered and no signals can pass from the SW1 domain or the SW2 domain to the AO domain.

At such time as the multiple power domain device seeks to exit the standby state, an exit sequence is initiated to transition both the SW1 domain and the SW2 domain from the unpowered state to the powered state. The exit sequence includes a step 903 of resetting both the SW1 domain and the SW2 domain while all isolation cells between both the SW1 domain and the SW2 domain and the AO domain remain enabled. That is, the SW1 domain and the SW2 domain receive power and the isolation cells remain enabled while the SW1 domain and the SW2 domain are in reset.

Once the SW1 domain and the SW2 domain are reset and are receiving power, the device exits the standby state and disables the isolation cells (allowing signals to pass through) between the AO domain and the SW1 domain, the AO domain and the SW2 domain, and the SW2 domain and the SW1 domain in step 904. For example, all of the AO-SW1 isolation enable circuit, the AO-SW2 isolation enable circuit, and the SW2-SW1 isolation enable circuit may be forced to '1'. The SW1 domain and the SW2 domains are out of reset as the PoR circuit in AO domain remains deasserted.

Figure 10:
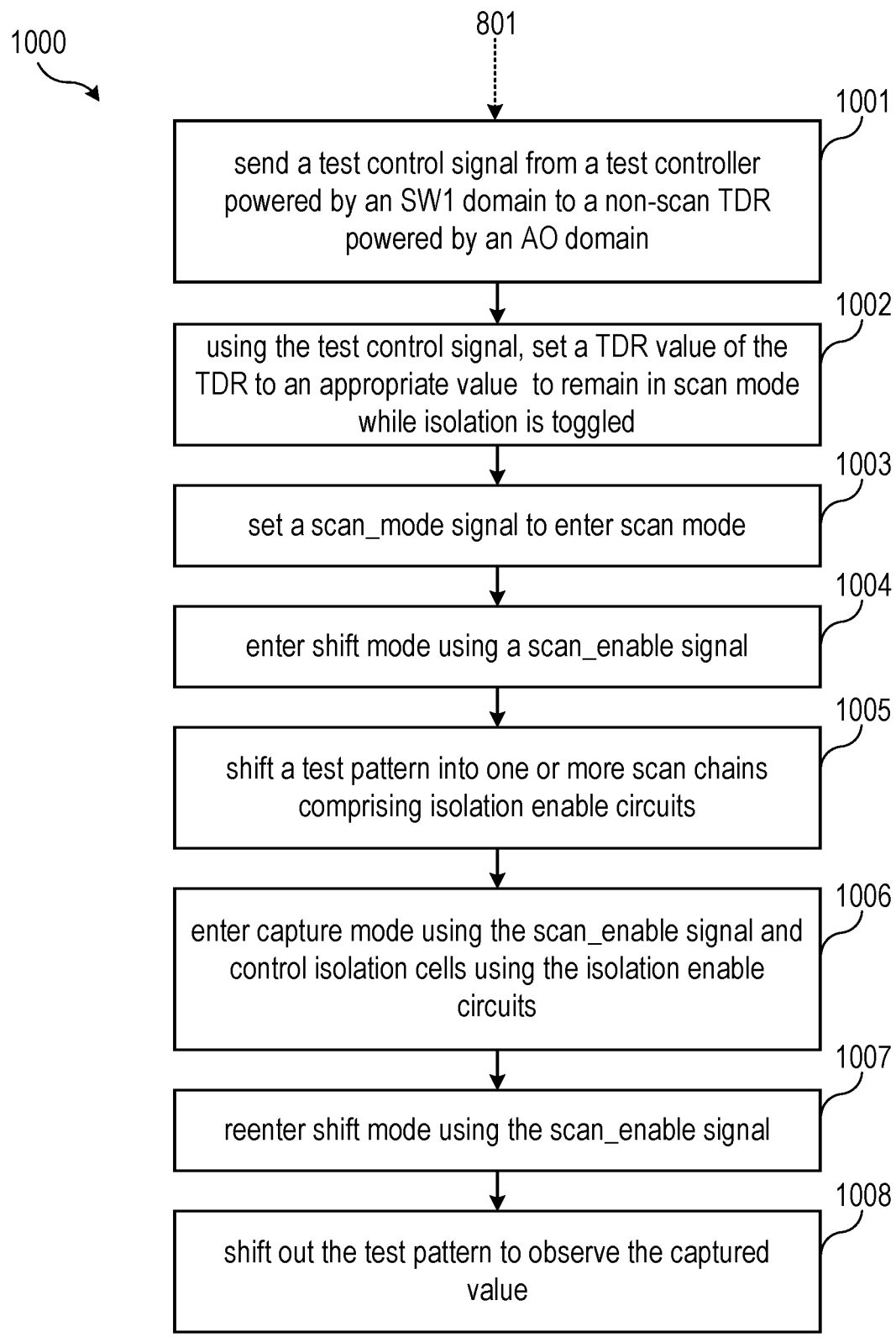
FIG. 10 illustrates an example method of testing a multiple power domain device that does not have a core wrapped AO domain in accordance with an embodiment of the invention.

FIG. 10 illustrates an example method of testing a multiple power domain device that does not have a core wrapped AO domain in accordance with an embodiment of the invention. The method of FIG. 10 may be performed using embodiment devices and systems as described herein. For example, the method of FIG. 10 may be combined with the embodiments of FIGS. 4 and 5. Further, the method of FIG. 10 may be combined with other methods such as the methods of FIGS. 8 and 9. Arrows in FIG. 10 are intended to indicate order of the steps, but are not intended to be limiting. The below method steps may be performed in any suitable order as may be apparent to a person of skill in the art.

Referring to FIG. 10, step 1001 of a method 1000 is to send a test control signal from a test controller powered by an SW1 domain to a non-scan TDR powered by an AO domain. Step 1001 is performed with all domains powered and all isolation cells in a disabled state allowing signals to pass through all domains. For example, step 1001 may be performed after a boot phase (e.g. step 801) has been completed.

Step 1002 is to set a TDR value of the TDR to an appropriate value for scan mode using the test control signal. For instance, the TDR value causes the AO domain and SW2 domain to remain in scan mode while toggling isolation. Additionally, the SW1 domain does not get reset when isolation is toggled during ATPG.

Step 1003 is to set the scan_mode signal to enter scan mode (e.g. to enter ATPG). Shift mode (e.g. ATPG shift mode) is then entered using the scan_enable signal (e.g. by forcing the scan_enable signal to '1') in step 1004. In mixed chain architectures (as shown in FIG. 5, for example), isolation cells will be kept in a disabled state by the scan_enable signal allowing signals to pass through to all domains.

Step 1005 is to shift a test pattern into one or more scan chains comprising isolation enable circuits (e.g. functional FFs). For example, the scan chains include the AO-SW1 isolation enable circuit, the AO-SW2 isolation enable circuit, and the SW2-SW1 isolation enable circuit.

After the test pattern is shifted into the scan chains, capture mode is entered using the scan_enable signal (e.g. by forcing the scan_enable signal to '0') in step 1006. In capture mode the isolation cells can be toggled as controlled by the AO-SW1 isolation enable circuit, the AO-SW2 isolation enable circuit, and the SW2-SW1 isolation enable circuit. For example, the TDR value in combination with logic gates (e.g. a scan mode OR gate, an SW1 reset OR gate, etc.) may maintain scan mode while isolation is toggled.

The result (i.e. a captured value) of the test pattern is in the scan chains following capture mode. Shift mode is entered again in step 1007 using the scan_enable signal. Step 1008 is to shift out the test pattern to observe the captured value. For example, the captured value may be observed on observation FFs and other functional FFs (e.g. other than isolation enable FFs) in the multiple power domain device.

Figure 11:
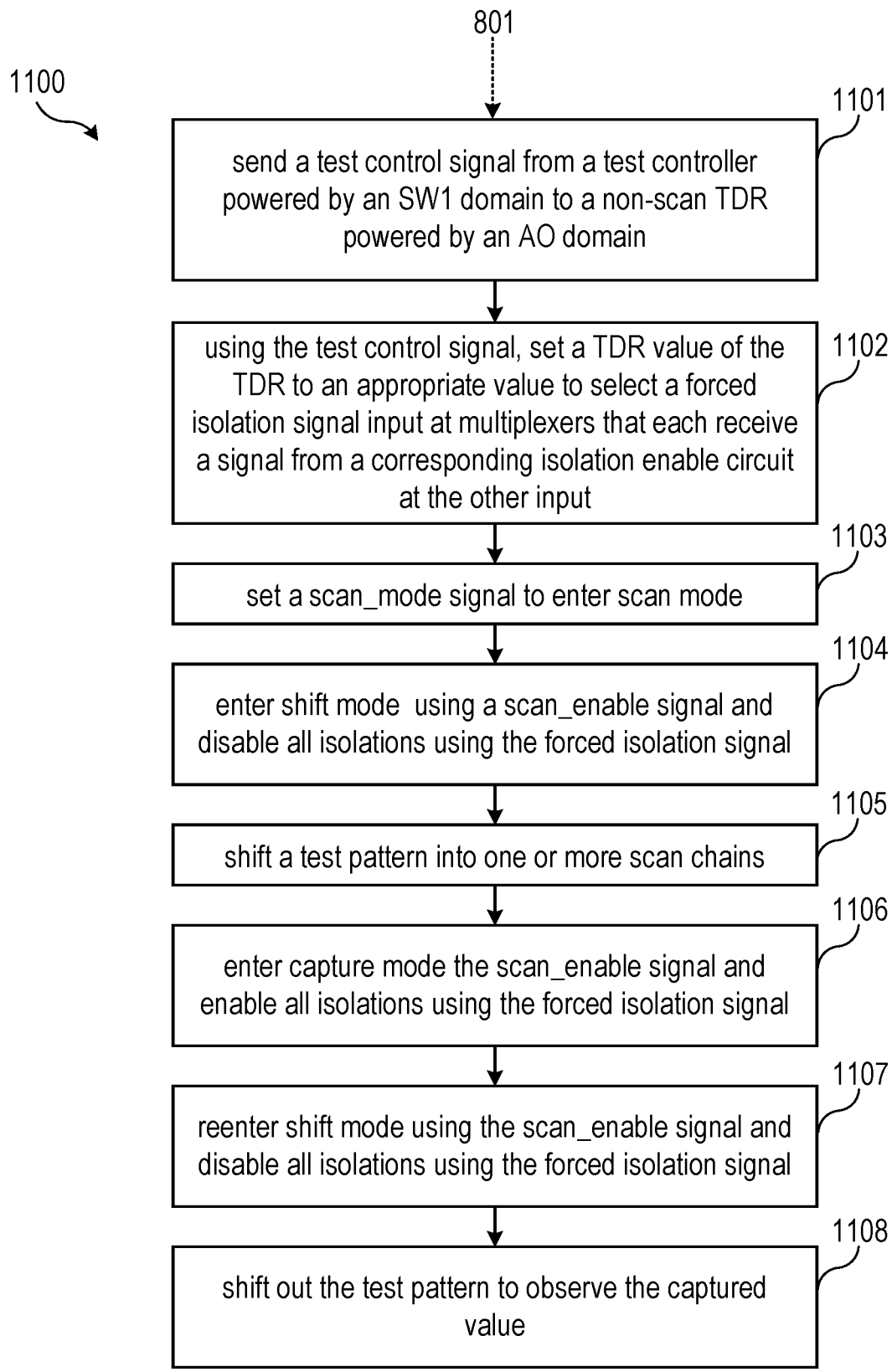
FIG. 11 illustrates an example method of testing a multiple power domain device with a core wrapped AO domain in accordance with an embodiment of the invention.

FIG. 11 illustrates an example method of testing a multiple power domain device with a core wrapped AO domain in accordance with an embodiment of the invention. The method of FIG. 11 may be performed using embodiment devices and systems as described herein. For example, the method of FIG. 11 may be combined with the embodiments of FIGS. 1-3. Further, the method of FIG. 11 may be combined with other methods such as the methods of FIGS. 7-9. Arrows in FIG. 11 are intended to indicate order of the steps, but are not intended to be limiting. The below method steps may be performed in any suitable order as may be apparent to a person of skill in the art.

Referring to FIG. 11, step 1101 of a method 1100 of send a test control signal from a test controller powered by an SW1 domain to a non-scan TDR powered by an AO domain. Step 1101 is performed with all domains powered and all isolation cells in a disabled state allowing signals to pass through all domains. For example, step 1101 may be performed after a boot phase (e.g. step 801) has been completed.

Step 1102 is to set a TDR value of the TDR to an appropriate value to select a forced isolation signal input at multiplexers that each receive a signal from a corresponding isolation enable circuit at the other input. The TDR value is coupled to the selector input of each of the multiplexers. For example, the TDR value may be coupled to an AO-SW1 multiplexer receiving an input from an AO-SW1 isolation enable circuit, an AO-SW2 multiplexer receiving an input from an AO-SW2 isolation enable circuit, and an SW2 multiplexer receiving an input from an SW2-SW1 isolation enable circuit.

Step 1103 is to set the scan_mode signal to enter scan mode (e.g. to enter ATPG). Shift mode (e.g. ATPG shift mode) is then entered using the scan_enable signal (e.g. by forcing the scan_enable signal to '1') and all isolations are disabled using the forced isolation signal in step 1104. That is, the forced isolation signal may be forced to '1' to disable all isolation cells coupled to multiplexers output that receive the force isolation signal selected by the TDR value.

Step 1105 includes shifting a test pattern into one or more scan chains. After the test pattern is shifted into the scan chains, capture mode is entered using the scan_enable signal (e.g. by forcing the scan_enable signal to '0') and all isolations are enabled using the forced isolation signal (e.g. forced to '0') in step 1106. The result (i.e. a captured value) of the test pattern is in the scan chains following capture mode. Shift mode is entered again in step 1107 using the scan_enable signal (e.g. forced to '1') and all isolations are disabled again using the forced isolation signal (e.g. forced to '1'). Step 1108 is to shift out the test pattern to observe the captured value. For example, the captured value may be observed on core wrapped FFs, observation FFs and other functional FFs (e.g. other than isolation enable FFs) in the multiple power domain device.

Example embodiments of the invention are summarized here. Other embodiments can also be understood from the entirety of the specification as well as from the claims filed herein.

Example 1. A method of testing a multiple power domain device, the method including: sending a test control signal from a test controller powered by a first switchable (SW1) power domain to a non-scan test data register (TDR) powered by an always on (AO) power domain, where the AO power domain includes an AO input and is configured to always receive power while the multiple power domain device is powered, and where the SW1 power domain includes an SW1 output and is configured to be switched between a powered state and an unpowered state while the multiple power domain device is powered; setting, using the test control signal, a TDR value of the TDR to enable a scan mode by bypassing a first isolation cell between the SW1 output and the AO input, the first isolation cell being configured to allow or disallow a first signal originating from the SW1 output to propagate through the first isolation cell to the AO input; and while the TDR value continuously enables the scan mode, shifting a test pattern into a scan chain including a functional isolation enable flip-flop coupled to the first isolation cell, capturing a test result from the scan chain, and shifting the test pattern out of the scan chain to observe the test result.

Example 2. The method of example 1, where bypassing the first isolation cell includes: performing a logical OR operation on the first signal and the TDR value using an OR gate powered by the AO power domain.

Example 3. The method of one of examples 1 and 2, where the first signal is a scan mode signal configured to place the multiple power domain device in the scan mode.

Example 4. The method of one of examples 1 to 3, where the TDR value also bypasses a second isolation cell between an AO output and an SW1 input simultaneously with bypassing the first isolation cell, the second isolation cell being configured to allow or disallow a second signal originating from the AO output to propagate to the SW1 input.

Example 5. The method of example 4, where bypassing the second isolation cell includes: performing a logical OR operation on the second signal and the TDR value using an OR gate powered by the SW1 power domain.

Example 6. The method of example 4, where in the second signal is a reset signal originating from a power-on-reset (PoR) circuit powered by the AO power domain and configured to reset circuits of the SW1 power domain.

Example 7. The method of one of examples 1 to 6, further including while the TDR value continuously enables scan mode: before shifting the test pattern into the scan chain, entering shift mode using a scan enable signal; before capturing the test result, entering capture mode using the scan enable signal, where the first isolation cell is controlled by an isolation enable circuit powered by the AO power domain while capturing the test result; and before shifting the test pattern out of the scan chain, reentering shift mode using the scan enable signal.

Example 8. A method of testing a multiple power domain device, the method including: sending a test control signal from a test controller powered by a first switchable (SW1) power domain to a non-scan test data register (TDR) powered by an always on (AO) power domain, where the AO power domain includes an AO input and core wrapped logic the AO power domain being configured to always receive power while the multiple power domain device is powered, where the SW1 power domain includes an SW1 output and is configured to be switched between a powered state and an unpowered state while the multiple power domain device is powered, and where the AO power domain further includes an AO multiplexer including an AO multiplexer output coupled to a first isolation cell configured to allow or disallow a first signal from propagating from the SW1 output to the AO input; setting a TDR value of the TDR to a first value using the test control signal, the TDR value being coupled to an AO selector input of the AO multiplexer; inputting a forced isolation signal at an AO domain connection; selecting the forced isolation signal using the first value at the AO selector input; and while the forced isolation signal is continuously selected by the first value, testing the AO power domain of the multiple power domain device.

Example 9. The method of example 8, where providing the forced isolation signal includes: providing a first forced isolation signal to the first isolation cell to disable isolation thereby allowing the first signal to propagate to the first AO input while shifting a test pattern into a scan chain of the core wrapped logic; and providing a second forced isolation signal to the first isolation cell to enable isolation thereby disallowing the first signal to propagate to the first AO input while capturing a test result from the scan chain.

Example 10. The method of one of examples 8 and 9, further including: while the output of the forced isolation signal is continuously selected by the first value, testing the AO power domain of the multiple power domain device.

Example 11. The method of one of examples 8 to 10, where the multiple power domain device includes a second switchable (SW2) power domain configured to be switched between a powered state and an unpowered state while the multiple power domain device is powered, the method further including: selecting the forced isolation signal using the first value at an SW2 selector input of an SW2 multiplexer powered by the SW2 power domain; and while the forced isolation signal is continuously selected by the first value, testing the SW2 power domain of the multiple power domain device.

Example 12. The method of one of examples 8 to 11, where the first signal is a scan mode signal configured to place the multiple power domain device in scan mode.

Example 13. The method of one of examples 8 to 12, where the TDR value is also coupled to a second isolation cell configured to allow or disallow a second signal originating from an AO output to propagate through a second isolation cell to an SW input simultaneously with allowing or disallowing the first signal to propagate through the first isolation cell.

Example 14. The method of example 13, where the second signal is a reset signal originating from a power-on-reset (PoR) circuit powered by the AO power domain and configured to reset circuits of the SW1 power domain.

Example 15. A multiple power domain device including: an always on (AO) power domain including an AO input and configured to always receive power while the multiple power domain device is powered; a first switchable (SW1) power domain including an SW1 output and configured to be switched between a powered state and an unpowered state while the multiple power domain device is powered; an isolation cell coupled between the SW1 output and the AO input; an isolation enable circuit powered by the AO power domain and configured to output an isolation enable signal to allow or disallow a first signal originating at the SW1 output from propagating to the AO input; a non-scan test data register (TDR) powered by the AO power domain; and a test controller powered by the SW1 power domain and coupled to the TDR, the test controller being configured to send a test control signal to the TDR to set a TDR value, and test for isolation enable faults by using the TDR value to maintain a scan mode of the AO power domain while the isolation enable signal is toggled.

Example 16. The multiple power domain device of example 15, where the isolation enable circuit is a functional flip-flop.

Example 17. The multiple power domain device of one of examples 15 and 16, further including: an observational flip-flop powered by the AO power domain and configured to capture the first signal while testing for isolation enable faults.

Example 18. The multiple power domain device of one of examples 15 to 17, further including: a power-on-reset (PoR) circuit powered by the AO power domain and configured to reset circuits of the AO power domain and circuits of the SW2 power domain, the circuits of the SW1 power domain including the test controller.

Example 19. The multiple power domain device of one of examples 15 to 18, further including: a multiplexer including a multiplexer output coupled to the isolation cell and a first multiplexer input coupled to the isolation enable circuit.

Example 20. The multiple power domain device of example 19, further including: an AO domain pad coupled to a second multiplexer input of the multiplexer.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of testing a multiple power domain device, the method comprising:
   sending a test control signal from a test controller powered by a first switchable (SW1) power domain to a non-scan test data register (TDR) powered by an always on (AO) power domain,
      wherein the AO power domain comprises an AO input and is configured to always receive power while the multiple power domain device is powered, and
      wherein the SW1 power domain comprises an SW1 output and is configured to be switched between a powered state and an unpowered state while the multiple power domain device is powered;
   setting, using the test control signal, a TDR value of the TDR to enable a scan mode by bypassing a first isolation cell between the SW1 output and the AO input, the first isolation cell being configured to allow or disallow a first signal originating from the SW1 output to propagate through the first isolation cell to the AO input; and
   while the TDR value continuously enables the scan mode,
      shifting a test pattern into a scan chain comprising a functional isolation enable flip-flop coupled to the first isolation cell,
      capturing a test result from the scan chain, and
      shifting the test pattern out of the scan chain to observe the test result.

2. The method of claim 1, wherein bypassing the first isolation cell comprises:
   performing a logical OR operation on the first signal and the TDR value using an OR gate powered by the AO power domain.

3. The method of claim 1, wherein the first signal is a scan mode signal configured to place the multiple power domain device in the scan mode.

4. The method of claim 1, wherein the TDR value also bypasses a second isolation cell between an AO output and an SW1 input simultaneously with bypassing the first isolation cell, the second isolation cell being configured to allow or disallow a second signal originating from the AO output to propagate to the SW1 input.

5. The method of claim 4, wherein bypassing the second isolation cell comprises:
performing a logical OR operation on the second signal and the TDR value using an OR gate powered by the SW1 power domain.

6. The method of claim 4, wherein in the second signal is a reset signal originating from a power-on-reset (PoR) circuit powered by the AO power domain and configured to reset circuits of the SW1 power domain.

7. The method of claim 1, further comprising while the TDR value continuously enables scan mode:
before shifting the test pattern into the scan chain, entering shift mode using a scan enable signal;
before capturing the test result, entering capture mode using the scan enable signal, wherein the first isolation cell is controlled by an isolation enable circuit powered by the AO power domain while capturing the test result; and
before shifting the test pattern out of the scan chain, reentering shift mode using the scan enable signal.

8. A method of testing a multiple power domain device, the method comprising:
sending a test control signal from a test controller powered by a first switchable (SW1) power domain to a non-scan test data register (TDR) powered by an always on (AO) power domain,
wherein the AO power domain comprises an AO input and core wrapped logic the AO power domain being configured to always receive power while the multiple power domain device is powered,
wherein the SW1 power domain comprises an SW1 output and is configured to be switched between a powered state and an unpowered state while the multiple power domain device is powered, and
wherein the AO power domain further comprises an AO multiplexer comprising an AO multiplexer output coupled to a first isolation cell configured to allow or disallow a first signal from propagating from the SW1 output to the AO input;
setting a TDR value of the TDR to a first value using the test control signal, the TDR value being coupled to an AO selector input of the AO multiplexer;
inputting a forced isolation signal at an AO domain connection;
selecting the forced isolation signal using the first value at the AO selector input; and
while the forced isolation signal is continuously selected by the first value, testing the AO power domain of the multiple power domain device.

9. The method of claim 8, wherein providing the forced isolation signal comprises:
providing a first forced isolation signal to the first isolation cell to disable isolation thereby allowing the first signal to propagate to the first AO input while shifting a test pattern into a scan chain of the core wrapped logic; and
providing a second forced isolation signal to the first isolation cell to enable isolation thereby disallowing the first signal to propagate to the first AO input while capturing a test result from the scan chain.

10. The method of claim 8, further comprising:
while the output of the forced isolation signal is continuously selected by the first value, testing the AO power domain of the multiple power domain device.

11. The method of claim 8, wherein the multiple power domain device comprises a second switchable (SW2) power domain configured to be switched between a powered state and an unpowered state while the multiple power domain device is powered, the method further comprising:
selecting the forced isolation signal using the first value at an SW2 selector input of an SW2 multiplexer powered by the SW2 power domain; and
while the forced isolation signal is continuously selected by the first value, testing the SW2 power domain of the multiple power domain device.

12. The method of claim 8, wherein the first signal is a scan mode signal configured to place the multiple power domain device in scan mode.

13. The method of claim 8, wherein the TDR value is also coupled to a second isolation cell configured to allow or disallow a second signal originating from an AO output to propagate through a second isolation cell to an SW1 input simultaneously with allowing or disallowing the first signal to propagate through the first isolation cell.

14. The method of claim 13, wherein the second signal is a reset signal originating from a power-on-reset (PoR) circuit powered by the AO power domain and configured to reset circuits of the SW1 power domain.

15. A multiple power domain device comprising:
an always on (AO) power domain comprising an AO input and configured to always receive power while the multiple power domain device is powered;
a first switchable (SW1) power domain comprising an SW1 output and configured to be switched between a powered state and an unpowered state while the multiple power domain device is powered;
an isolation cell coupled between the SW1 output and the AO input;
an isolation enable circuit powered by the AO power domain and configured to output an isolation enable signal to allow or disallow a first signal originating at the SW1 output from propagating to the AO input;
a non-scan test data register (TDR) powered by the AO power domain; and
a test controller powered by the SW1 power domain and coupled to the TDR, the test controller being configured to
send a test control signal to the TDR to set a TDR value, and
test for isolation enable faults by using the TDR value to maintain a scan mode of the AO power domain while the isolation enable signal is toggled.

16. The multiple power domain device of claim 15, wherein the isolation enable circuit is a functional flip-flop.

17. The multiple power domain device of claim 15, further comprising:
an observational flip-flop powered by the AO power domain and configured to capture the first signal while testing for isolation enable faults.

18. The multiple power domain device of claim 15, further comprising:
a power-on-reset (PoR) circuit powered by the AO power domain and configured to reset circuits of the AO power domain and circuits of the SW1 power domain, the circuits of the SW1 power domain comprising the test controller.

19. The multiple power domain device of claim 15, further comprising:
a multiplexer comprising a multiplexer output coupled to the isolation cell and a first multiplexer input coupled to the isolation enable circuit.

20. The multiple power domain device of claim 19, further comprising:

an AO domain pad coupled to a second multiplexer input of the multiplexer.

\* \* \* \* \*